United States Patent
Ginsburg et al.

(10) Patent No.: US 8,472,884 B2
(45) Date of Patent: Jun. 25, 2013

(54) TERAHERTZ PHASED ARRAY SYSTEM

(75) Inventors: Brian P. Ginsburg, Allen, TX (US);
Vijay B. Rentala, Plano, TX (US);
Srinath M. Ramaswamy, Murphy, TX (US); Baher S. Haroun, Allen, TX (US);
Eunyoung Seok, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 427 days.

(21) Appl. No.: 12/878,484

(22) Filed: Sep. 9, 2010

(65) Prior Publication Data

US 2012/0062286 A1    Mar. 15, 2012

(51) Int. Cl.
*H04B 17/00* (2006.01)
(52) U.S. Cl.
USPC ............. 455/67.16; 455/276.1; 455/304; 455/23; 343/702
(58) Field of Classification Search
USPC .......... 455/67.16, 276.1, 304, 23, 139, 180.3, 455/205, 225; 343/702, 853, 778; 250/340
See application file for complete search history.

(56) References Cited

U.S. PATENT DOCUMENTS

| | | | |
|---|---|---|---|
| 5,250,953 | A | 10/1993 | Jones et al. |
| 5,495,249 | A | 2/1996 | Chazelle et al. |
| 6,587,072 | B1 | 7/2003 | Gresham et al. |
| 7,884,768 | B2 * | 2/2011 | Navarro et al. .............. 343/702 |
| 8,077,083 | B2 * | 12/2011 | Blake ...................... 342/357.34 |
| 2012/0261579 | A1 * | 10/2012 | Ramaswamy et al. ........ 250/340 |
| 2012/0313895 | A1 * | 12/2012 | Haroun et al. ............... 345/175 |

FOREIGN PATENT DOCUMENTS

| | | |
|---|---|---|
| EP | 0082427 | 6/1983 |
| WO | WO2009028718 | 3/2009 |

OTHER PUBLICATIONS

"Filling the THz Gap—High Power Sources and Applications," Institute of Physics Publishing, Reports on Progress in Physics, 2006, doi:10.1088/0034-4885/69/2/R01, pp. 301-326 (Gwyn P Williams).
"Low-Power mm-Wave Components up to 104GHz in 90nm CMOS," ISSCC 2007, Feb. 2007, San Francisco, CA, pp. 200-201 (Heydari, B.; Bohsali, M.; Adabi, E.; Niknejad, A.M.).
"Millimeter-Wave CMOS Digital Controlled Artificial Dielectric Differential Mode Transmission Lines for Reconfigurable ICs," IEEE MTT-S IMS, 2008, pp. 181-184 (LaRocca, T.; Sai-Wang Tam; Daquan Huang; Qun Gu; Socher, E.; Hant, W.; Chang, F.).
A 52 GHz Phased-Array Receiver Front-End in 90 nm Digital CMOS, JSSC Dec. 2008, pp. 2651-2659 (Scheir, K.; Bronckers, S.; Borremans, J.; Wambacq, P.; Rolain, Y).

(Continued)

*Primary Examiner* — Minh D Dao
(74) *Attorney, Agent, or Firm* — John R. Pessetto; W. James Brady; Frederick J. Telecky, Jr.

(57) ABSTRACT

Microelectronics have now developed to the point where radiation within the terahertz frequency range can be generated and used. Here, an integrated circuit or IC is provided that includes a phased array radar system, which uses terahertz radiation. In order to accomplish this, several features are employed; namely, a lower frequency signal is propagated to transceivers, which multiplies the frequency up to the desired frequency range. To overcome the losses from the multiplication, an injection locked voltage controlled oscillator (ILVCO) is used, and a high frequency power amplifier (PA) can then be used to amplify the signal for transmission.

31 Claims, 16 Drawing Sheets

OTHER PUBLICATIONS

"A Multi-Path Gated Ring Oscillator TDC With First-Order Noise Shaping," IEEE Journal of Solid-State Circuits, vol. 44, No. 4, Apr. 2009, pp. 1089-1098 (Matthew Z. Straayer and Michael H. Perrott).

"A Bidirectional TX/RX Four element Phased-Array at 60GHz with RF-IF Conversion Block in 90nm CMOS Process," 2009 IEEE Radio Freq. Integrated Circuits Symposium, pp. 207-210 (Cohen, E.; Jakobson, C.; Ravid, S.; Ritter, D.).

"A Millimeter-Wave (40-45 GHz) 16-Element Phased-Array Transmitter in 0.18-um SiGe BiCMOS Technology," IEEE J. of Solid State Circuits, vol. 44, No. 5, May 2009, pp. 1498-1509 (Kwang-Jin Koh; May, J.W.; Rebeiz, G.M.).

"Injection- and Phase-Locking Techniques for Beam Control," IEEE Transactions on Microwave Theory and Techniques, vol. 46, No. 11, Nov. 1998, pp. 1920-1929 (Robert A. York and Tatsuo Itoh).

"An Integrated Subharmonic Coupled-Oscillator Scheme for a 60-GHz Phased-Array Transmitter," IEEE Transactions on Microwave Theory and Techniques, vol. 54, No. 12, Dec. 2006, pp. 4271-4280 (James F. Buckwalter, Aydin Babakhani, Abbas Komijani, and Ali Hajimiri).

Injection-Locked Oscillators with High-Order-Division Operation for Microwave/Millimeter-wave Signal Generation, Dissertation, Oct. 9, 2007, (Huang).

PCT Search Report mailed Sep. 29, 2011.

* cited by examiner

TERAHERTZ PHASED ARRAY SYSTEM

CROSS-REFERENCE TO RELATED APPLICATIONS

This application is related to co-pending U.S. patent application Ser. No. 12/871,626, entitled "DOWNCONVERSION MIXER," filed on Aug. 30, 2010, which is hereby incorporated by reference for all purposes.

TECHNICAL FIELD

The invention relates generally to a phased array and, more particularly, to an "on-chip" terahertz phased array system.

BACKGROUND

Phase array systems have become commonplace, having several uses. The most common use for phased array systems is radar systems (i.e., pulse radar and Doppler shift radars). As a matter of fact, phased array radar has replaced most of the previous generations of mechanical sweep radar systems because there is a lower likelihood of failure due to wear since mechanic components are replaced with electronics and because the sweep rates are much higher.

Turning to FIG. 1, block diagram illustrating the basic functionality of a conventional phased array system 100. System 100 generally comprises a signal generator 102, phase shifters 104-1 to 104-$k$, a phased array 110 that includes radiators 106-1 to 106-$k$, and a direction controller 108. In operation, the signal generator 102 provides a signal that is to be transmitted (i.e., pulse for a pulse radar). Based on the desired direction, the direction controller 108 provides control signals to the phase shifters 104-1 to 104-$k$, which varies the phase of the signal provided to each of the radiators 106-1 to 106-$k$ within the phased array. Because the signals transmitted through radiators 106-1 through 106-$k$ are generally out-of-phase with one another, constructive and destructive interference of the radiated signal forms a beam in a desired direction.

These conventional systems, though, have been limited to conventional radio frequency (RF) frequency ranges. For example, the frequency range for conventional radar is between 3 MHz (for HF-band radar) and 110 GHz (for W-band radar). A reason for the use of these relatively low frequency ranges is that there has, historically, been an unavailability of compact semiconductor sources of coherent radiation at the terahertz frequency range (which is generally between 0.1 THz and 10 THz). Generally, electronics and oscillators in the microwave range run out of power gain with increasing frequency, and typical broadband infrared blackbody sources begin losing available power within this region. Use of terahertz radiation, however, is highly desirable because of its unique properties. Namely, terahertz radiation has properties of lower frequency radiation (i.e., microwaves) in that it can be generated electrically and higher frequency radiation (i.e., visible light) in that it can be controlled using optics.

Today, there exists two general types of terahertz sources: incoherent source and coherent sources. The incoherent sources are generally broadband incoherent thermal sources, which includes ultra-short femtosecond pulsed laser exciting photo conductive antennas, nonlinear electro-optical crystals, or non-linear transmission lines that suffers from very poor conversion efficiency (1 W laser pulse produces broadband energy in the nW-mW range). The coherent sources are generally narrowband continuous wave (CW) coherent sources which include diode multiplying microwave oscillators, gas lasers using carbon dioxide laser pumping methanol or cyanic acid, optical down conversion by difference mixing, and semiconductor quantum lasing. These coherent sources, though, generally consume a large amount of power, are not compact, require exotic materials, and/or are expensive.

Therefore, there is a need for a compact source of terahertz radiation, namely integrated into an integrated circuit.

Some examples of conventional circuits are: Williams, "Filling the THz Gap," doi:10.1088/0034-4885/69/2/R01; Heydari et al., "Low-Power mm-Wave Components up to 104 GHz in 90 nm CMOS," *ISSCC* 2007, pp. 200-201, February 2007, San Francisco, Calif.; LaRocca et al., "Millimeter-Wave CMOS Digital Controlled Artificial Dielectric Differential Mode Transmission Lines for Reconfigurable ICs," IEEE MTT-S IMS, 2008; Scheir et al., "A 52 GHz Phased-Array Receiver Front-End in 90 nm Digital CMOS" *JSSC December* 2008, pp. 2651-2659; Straayer et al. "A Multi-Path Gated Ring Oscillator TDC With First-Order Noise Shaping," *IEEE J. of Solid State Circuits*, Vol. 44, No. 4, April 2009, pp. 1089-1098; Huang, "Injection-Locked Oscillators with High-Order-Division Operation for Microwave/Millimeter-wave Signal Generation," Dissertation, Oct. 9, 2007; Cohen et al., "A bidirectional TX/RX four element phased-array at 60 HGz with RF-IF conversion block in 90 nm CMOS processes," 2009 *IEEE Radio Freq. Integrated Circuits Symposium*, pp. 207-210; Koh et al., "A Millimeter-Wave (40-65 GHz) 16-Element Phased-Array Transmitter in 0.18-μm SiGe BiCMOS Technology," *IEEE J. of Solid State Circuits*, Vol. 44, No. 5, May 2009, pp. 1498-1509; York et al., "Injection- and Phase-locking Techniques for Beam Control," *IEEE Transactions on Microwave Theory and Techniques*, Vol. 46, No. 11, November 1998, pp. 1920-1929; Buckwalter et al., "An Integrated Subharmonic Coupled-Oscillator Scheme for a 60-GHz Phased Array Transmitter," *IEEE Transactions on Microwave Theory and Techniques*, Vol. 54, No. 12, December 2006, pp. 4271-4280; and PCT Publ. No. WO2009028718.

SUMMARY

A preferred embodiment of the present invention, accordingly, provides an apparatus. The apparatus comprises a local oscillator that generates a local oscillator signal and a pulse signal; a distribution network that is coupled to the local oscillator so as to at least distribute the local oscillator signal; a plurality of transceivers, wherein each transceiver has a radiator, a transmit path that is coupled to the radiator, and a receive path that is coupled to the radiator, and wherein the transmit path for each transceiver includes: a phase shifter is coupled to the distribution network so as to receive the local oscillator signal; a multiplier that is coupled to the phase shifter so as to receive a phase shifted local oscillator signal; a injection-locked voltage controlled oscillator (ILVCO) that is coupled to the multiplier; and a power amplifier (PA) that is coupled to the ILVCO and that receives the pulse signal; and receiver circuitry that is coupled to the receive path for each of the transceivers.

In accordance with a preferred embodiment of the present invention, the local oscillator signal further comprises a first local oscillator signal, and wherein the local oscillator further comprises: a phase locked loop (PLL) that receives a reference signal and that generates the first oscillator signal and a second local oscillator signal; a counter that receives a control signal and that is coupled to the PLL; and a pulse generator that is coupled to the counter and the PLL, wherein the pulse generator generates the pulse signal based at least in part on the second local oscillator signal and an output from the counter.

In accordance with a preferred embodiment of the present invention, the PLL further comprises: a phase detector that receives the reference signal; a charge pump that is coupled to the phase detector; a low pass filter that is coupled to the charge pump; a voltage controlled oscillator (VCO) that is coupled to the low pass filter; an amplifier that is coupled to the VCO; and a plurality of dividers that are coupled in series with one another between the VCO and the phase detector.

In accordance with a preferred embodiment of the present invention, the transmit path for each transceiver further comprises an amplifier that is coupled between the phase shifter and the multiplier.

In accordance with a preferred embodiment of the present invention, the ILVCO further comprises: a first node; a second node; an inductive network that is coupled between the first and second nodes; a capacitive network that is coupled between the first and second nodes; a first MOS transistor that is coupled to the first node at its source or its drain and to the second node at its gate; a second MOS transistor that is coupled to the second node at its source or its drain and to the first node at its gate; a third MOS transistor that is coupled generally in parallel to the first MOS transistor; a fourth MOS transistor that is coupled generally in parallel to the second MOS transistor; and a balun that is coupled to the amplifier and that is coupled to the gates of the third and fourth MOS transistors.

In accordance with a preferred embodiment of the present invention, the PA further comprises: a first capacitor that receives an output from the ILVCO; a first inductor that is coupled to the first capacitor; a second inductor that is coupled to the first inductor; a second capacitor that is coupled to the second inductor; a third inductor; a fifth MOS transistor that is coupled to the first and second inductor at its gate and that is coupled to the third inductor; a fourth inductor; a fifth inductor; a sixth MOS transistor that receives the pulse signal at its gate and that is coupled between the fourth and fifth inductors; and a third capacitor that is coupled between the third and fifth inductors.

In accordance with a preferred embodiment of the present invention, the amplifier further comprises a first amplifier, and wherein the multiplier further comprises a first multiplier, and wherein the receive path for each transceiver further comprises: a low noise amplifier (LNA) that is coupled to the radiator; a second multiplier that is coupled to the first amplifier; a second amplifier that is coupled to second multiplier; a mixer that is coupled to the LNA and the second amplifier; and a third amplifier that is coupled to the mixer.

In accordance with a preferred embodiment of the present invention, the mixer further comprises a first mixer, and wherein the receive path for each transceiver further comprises: a second mixer that is coupled to the first and third amplifiers; and a fourth amplifier that is coupled to the second mixer.

In accordance with a preferred embodiment of the present invention, the amplifier further comprises a first amplifier, and wherein the transmit path for each transceiver further comprises a flip-flop that receives the pulse signal and that is coupled to the first amplifier, the ILVCO, and the PA, and wherein the multiplier further comprises a first multiplier, and wherein the receive path for each transceiver further comprises: an LNA that is coupled to the radiator; a second amplifier that is coupled to the ILVCO; a mixer that is coupled to the LNA and the second amplifier; and a third amplifier that is coupled to the mixer.

In accordance with a preferred embodiment of the present invention, each phase shifter further comprises: a first input terminal; a second input terminal; a first inductor that is coupled to the first input terminal; a second inductor that is coupled to the second input terminal; and a plurality of phase shifters, wherein each phase shifter includes: a first MOS transistor that is coupled to the first input terminal at its drain; a second MOS transistor that is coupled to the second input terminal at its drain; and a third MOS transistor that is coupled to the sources of the first and second MOS transistors at its drain.

In accordance with a preferred embodiment of the present invention, the multiplier further comprises: a differential choke; a rectifying interleaver that is coupled to the differential choke; and a VCO that is coupled to the rectifying interleaver.

In accordance with a preferred embodiment of the present invention, the receiver circuitry further comprises: a summing circuit that is coupled to the receive path for each transceiver; an amplifier that is coupled to the summing circuit; a filter that is coupled to the amplifier; and digitization circuit that is coupled to the amplifier.

In accordance with a preferred embodiment of the present invention, the local oscillator signal further comprises a first local oscillator signal, and wherein the local oscillator generates a second local oscillator signal, and wherein the receiver circuit further comprises a mixer that is coupled between the summing circuit and the amplifier and that receives the second local oscillator signal.

In accordance with a preferred embodiment of the present invention, an apparatus is provided. The apparatus comprises a local oscillator including: a phase detector that receives a reference signal; a charge pump that is coupled to the phase detector; a low pass filter that is coupled to the charge pump; a local oscillator VCO that generates a first local oscillator signal having that is greater than 40 GHz; a plurality of dividers coupled in series with one another between the local oscillator VCO and the phase detector so as to provide a feedback signal to the phase detector that is generated from the first local oscillator signal, wherein the at least one of the plurality of dividers generates a second local oscillator having a frequency that is greater than 20 GHz; a counter that receives the feedback signal and a control signal; and a pulse generator that receives the second local oscillator signal, that is coupled to the counter, and that generates a pulse signal; a distribution network that is coupled to the local oscillator so as to at least distribute the first local oscillator signal; a plurality of transceivers, wherein each transceiver has a radiator, a transmit path that is coupled to the radiator, and a receive path that is coupled to the radiator, and wherein the radiators are arranged into an array, and wherein the transmit path for each transceiver includes: a phase shifter is coupled to the distribution network so as to receive the first local oscillator signal; a multiplier that is coupled to the phase shifter so as to receive a phase shifted first local oscillator signal; an ILVCO having: a first node; a second node; an inductive network that is coupled between the first and second nodes; a capacitive network that is coupled between the first and second nodes; a first MOS transistor that is coupled to the first node at its source or its drain and to the second node at its gate; a second MOS transistor that is coupled to the second node at its source or its drain and to the first node at its gate; a third MOS transistor that is coupled generally in parallel to the first MOS transistor; a fourth MOS transistor that is coupled generally in parallel to the second MOS transistor; and a balun that is coupled to the first multiplier and the gates of the third and fourth MOS transistors; a PA that is coupled to the ILVCO and its radiator and that receives the pulse signal; and receiver circuitry that is coupled to the receive path for each of the transceivers.

In accordance with a preferred embodiment of the present invention, an apparatus is provided. The apparatus comprises a plurality of radiators that are arranged in a pattern for form an array; a local oscillator that generates a local oscillator signal and a pulse signal; a distribution network that is coupled to the local oscillator so as to at least distribute the local oscillator signal; a plurality of transmitter paths, wherein each transmitter path is coupled between the distribution network and at least one of the radiators, and wherein each transmit path includes: a phase shifter is coupled to the distribution network so as to receive the local oscillator signal; a multiplier that is coupled to the phase shifter so as to receive a phase shifted local oscillator signal; an ILVCO that is coupled to the multiplier; and a PA that is coupled to the ILVCO and that receives the pulse signal; and a plurality of receiver paths, wherein each receiver path is coupled to at least one of the radiators; receiver circuitry that is coupled to each receive path; and a controller that is coupled to each phase shifter.

In accordance with a preferred embodiment of the present invention, the summing circuit further comprises a summing amplifier tree.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
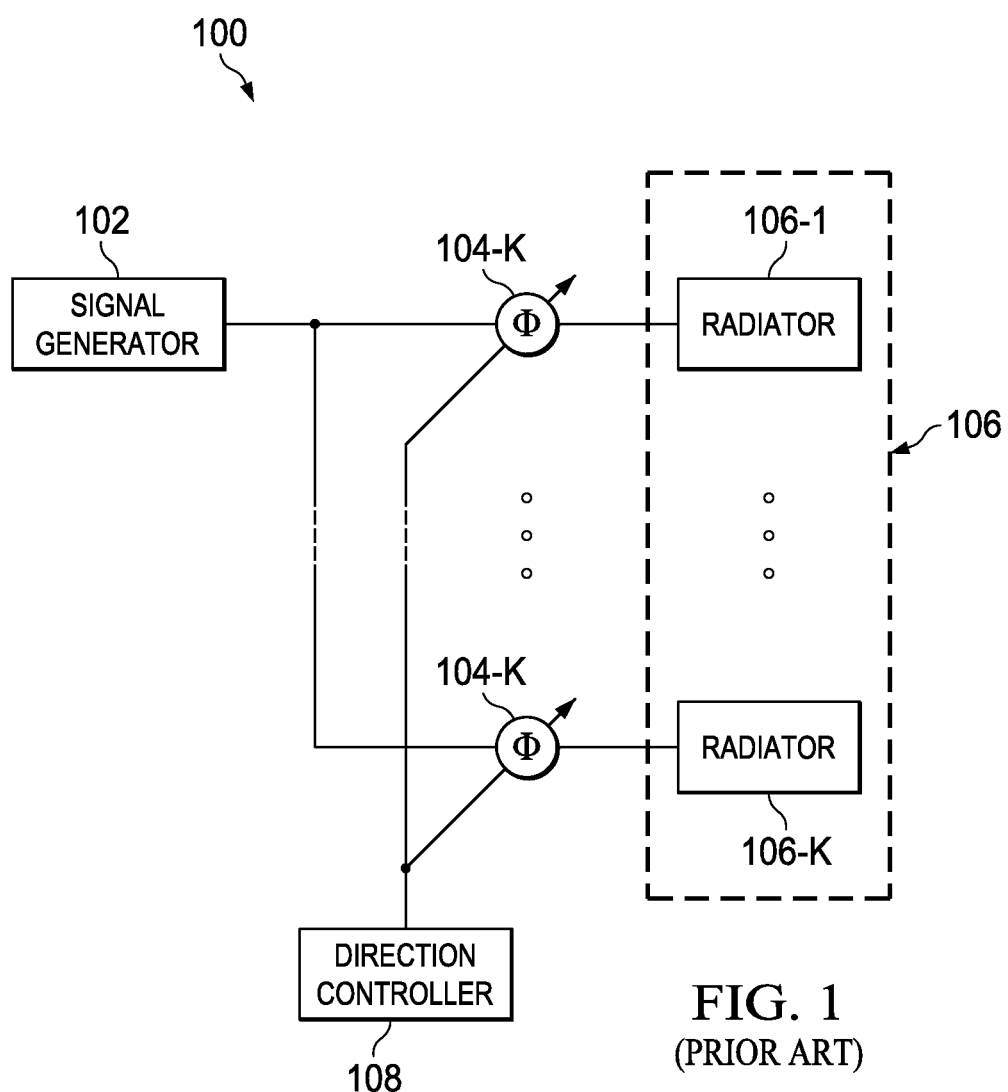
FIG. 1 is an example of a conventional phased array system.

Refer now to the drawings wherein depicted elements are, for the sake of clarity, not necessarily shown to scale and wherein like or similar elements are designated by the same reference numeral through the several views.

Figure 2:
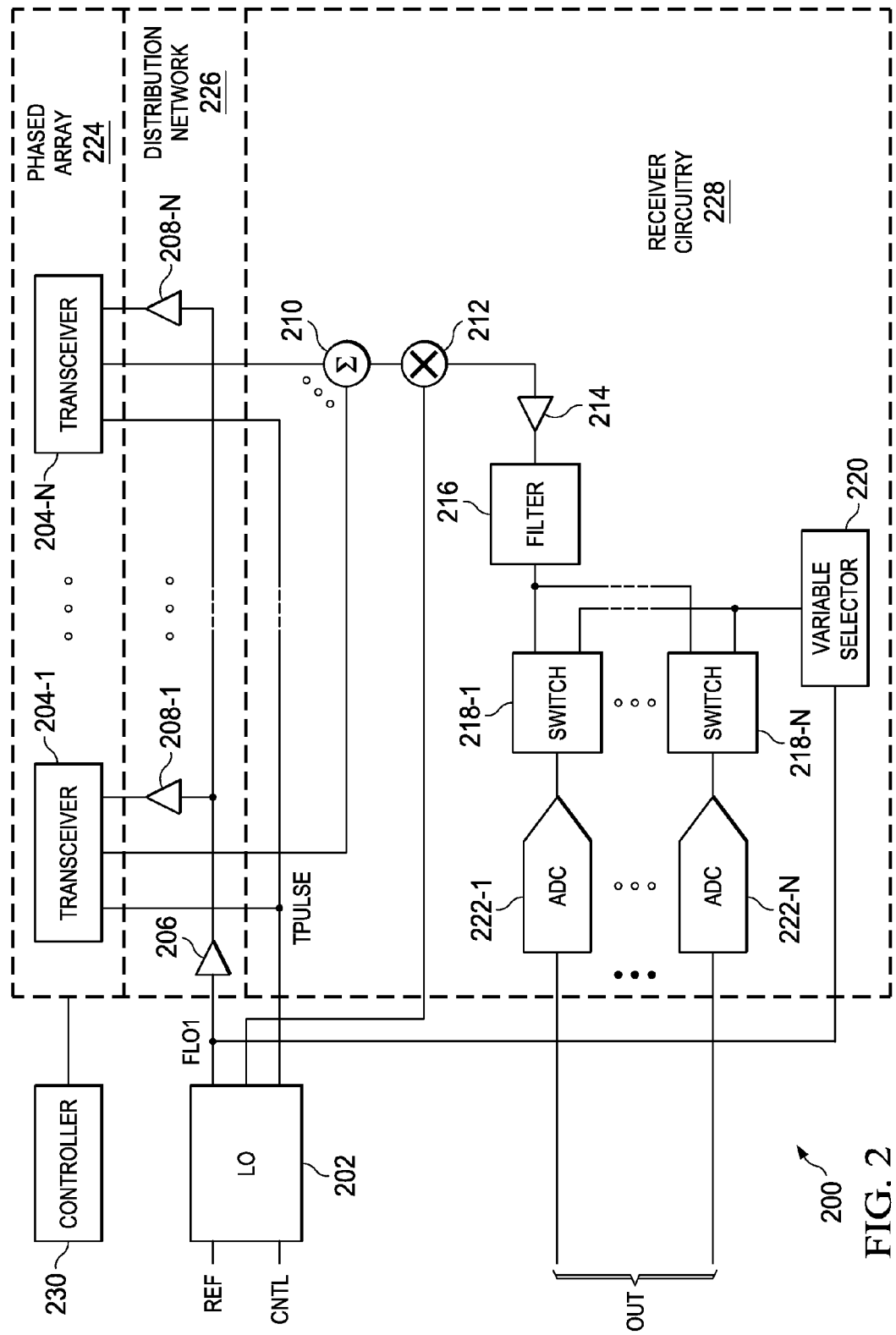
FIG. 2 is a block diagram of an example of a phased array system in accordance with a preferred embodiment of the present invention.

Turning to FIG. 2, a phased array system 200 in accordance with a preferred embodiment of the present invention can be seen. The phase array system 200 generally comprises a LO 202, a phased array 224, a distribution network 226, receiver circuitry 228, and controller 208. The phased array 224 generally comprises several transceivers 204-1 to 204-N arranged in an array. The distribution network 226 generally comprises amplifiers 206 and 208-1 to 208-N. Additionally the receiver circuitry generally comprises a summing circuit 210, a mixer 212, amplifier 214, filter 216, switches 218-1 to 218-N, variable selector 220, and ADCs 222-1 to 222-N.

In operation, phased array system 200 (which is generally incorporated into an integrated circuit or IC) can generate a short range radar system that operates in the terahertz frequency range (which is generally between 0.1 THz and 10 THz). To accomplish this, local oscillator 202 generates a high frequency signal FL01 that is on the order of tens to hundreds of gigahertz (i.e., 40 GHz, 50 GHz, 67 GHz, and 100 GHz.) and a pulse signal TPUSLE. The distribution network 226 then provides signal FL01 to each of the transceivers 204-1 to 204-N such that the signals received by each of transceivers 104-1 to 204-N are substantially in-phase. A controller 208 provides a control signal to array 224, which phase-adjusts the transceivers 204-1 to 204-N with respect to one another to direct a beam of terahertz frequency radiation. The transceivers 204-1 to 204-N can then receive reflected radiation back from a target, which is provided to summing circuit 210. The output of summing circuit 210 is the converted to a digital signal by a mixer 212, amplifier 214, filter 216, switches 218-1 to 218-N, variable selector 220, and ADCs 222-1 to 222-N. Additionally, mixer 212 can receive a divided signal from LO 202 (i.e., FL01/2 or another synthesized signal) or can be removed (typically for 40 GHtz or less).

Generally, this phased array system 200 has several different types of operational modes: pulsed, continuous, and stepped frequency. For a pulsed operational mode, a pulse of terahertz radiation is directed toward a target. The continuous operational mode uses a continuously generated beam, which is generally accomplished by effective "shutting off" the pulse signal TPULSE. Finally, stepped frequency allows to frequency of the terahertz beam to be changed, which can be accomplished by employing a bank of local oscillators (i.e., 202). For the pulsed operational mode, in particular, the range of the system 200 is governed by the following equation:

$$R = \sqrt[4]{\sigma \frac{PG^2 \lambda n E(n)}{(4\pi)^3 kTBF\left(\frac{S}{N}\right)}}, \quad (1)$$

where:
  R is distance that can be measured or range;
  σ is the radar cross section of the target (usually not equal to the physical cross section);
  S/N is single pulse SNR at the intermediate frequency IF filter output (envelope detector input);
  kTB is the effective incoming noise power in receiver bandwidth B (B≈1/pulsewidth);
  F is noise figure of the receiver (derived parameter);
  P is the peak transmitter power;
  G is the antenna power gain;
  λ is wavelength of the radiation (i.e., for 200 GHz, ≈1.5 mm);
  n is number of integrations of pulses in the receiver (multi-pulse averaging); and
  E(n) is the efficiency of integration.

For a monolithically integrated, low power IC that includes system 200, this range is generally less than one meter.

Figure 3:
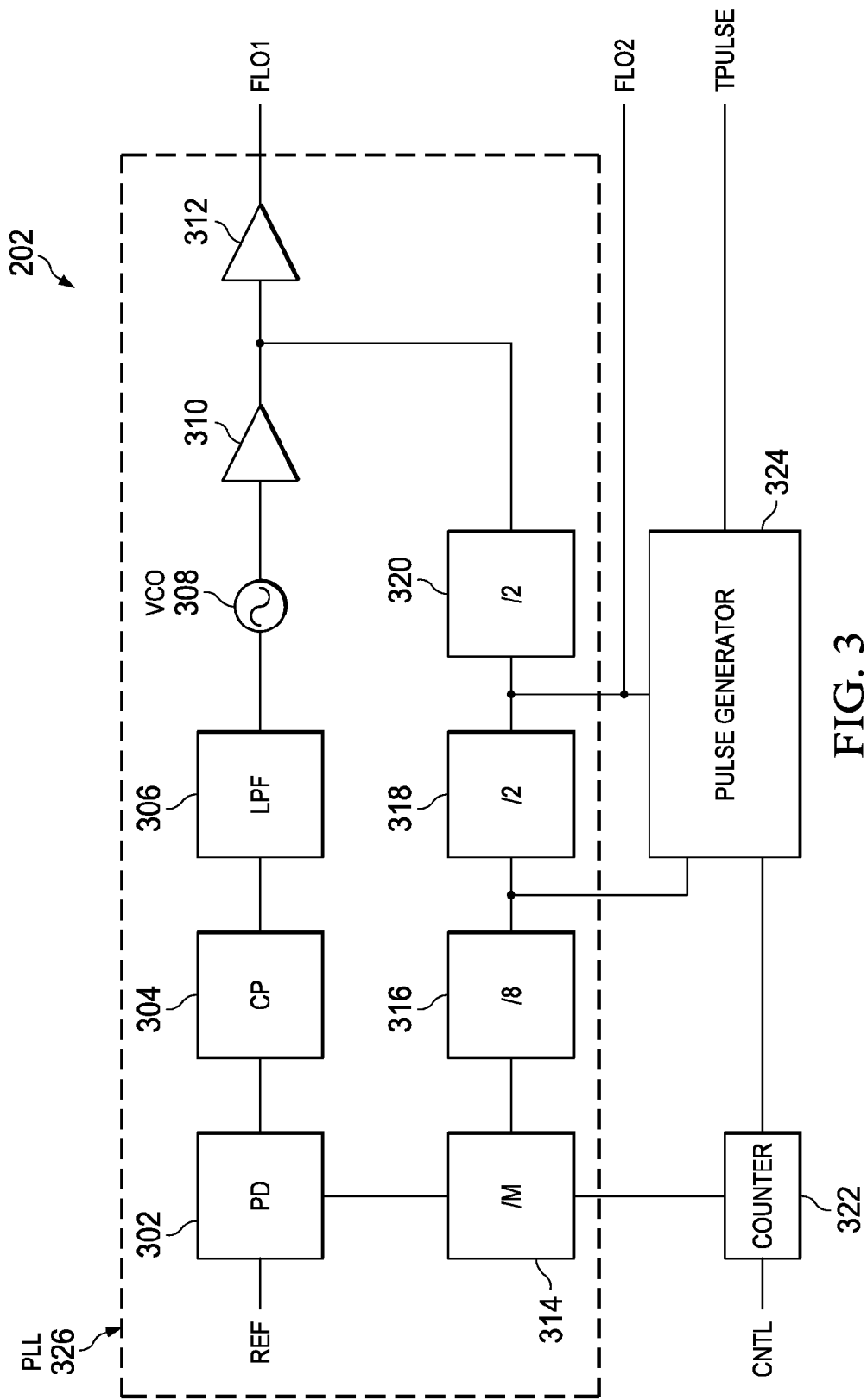
FIG. 3 is a block diagram of an example of the local oscillator (LO) of FIG. 2.

Turning to FIG. 3, an example of the LO 202 can be seen in greater detail. Generally, this LO 202 employs a phase locked loop (PLL) 326 that generates signals FL01 and FL02 from reference signal REF and employs counter 322 and pulse generator 324 to produce the pulse signal TPULSE. PLL 326 is generally comprised of a phase detector 302, charge pump 304, low pass filter 304, amplifiers 310 and 312, voltage controlled oscillator (VCO) 308, and dividers 320, 318, 316, and 314. In operation, the phase detector 302 receives a feedback signal from divider 314 and the reference signal REF, and (along with charge pump 304 and low pass filter 306) generates a tuning voltage for VCO 308. Typically, VCO 308 generates a high frequency signal (i.e., 100 GHz, 67 GHz, 50 GHz, or 40 GHz) which is amplified by amplifiers 310 and 312, producing signal FL01. Divider 320 (which is generally an injection-locked, divide-by-2 frequency divider) receives the output of amplifier to output signal FL02. Signal FL02 is then provided to divider 318 (which is generally a divide-by-2 current mode logic divider). The output of divider 318 is provided to divider 316 (which is generally a divide-by-8 current mode logic divider), and the output of divider 316 is provided to divider 314 (which is generally a divide-by-M CMOS divider) to generate the feedback signal. The counter 322 generates a count signal based on a control signal CNTL and the feedback signal from divider 314, and the pulse generator 234 produces the pulse signal TPULSE based at least in part on the count signal from counter 322 and the outputs of dividers 318 and 320.

Figure 4:
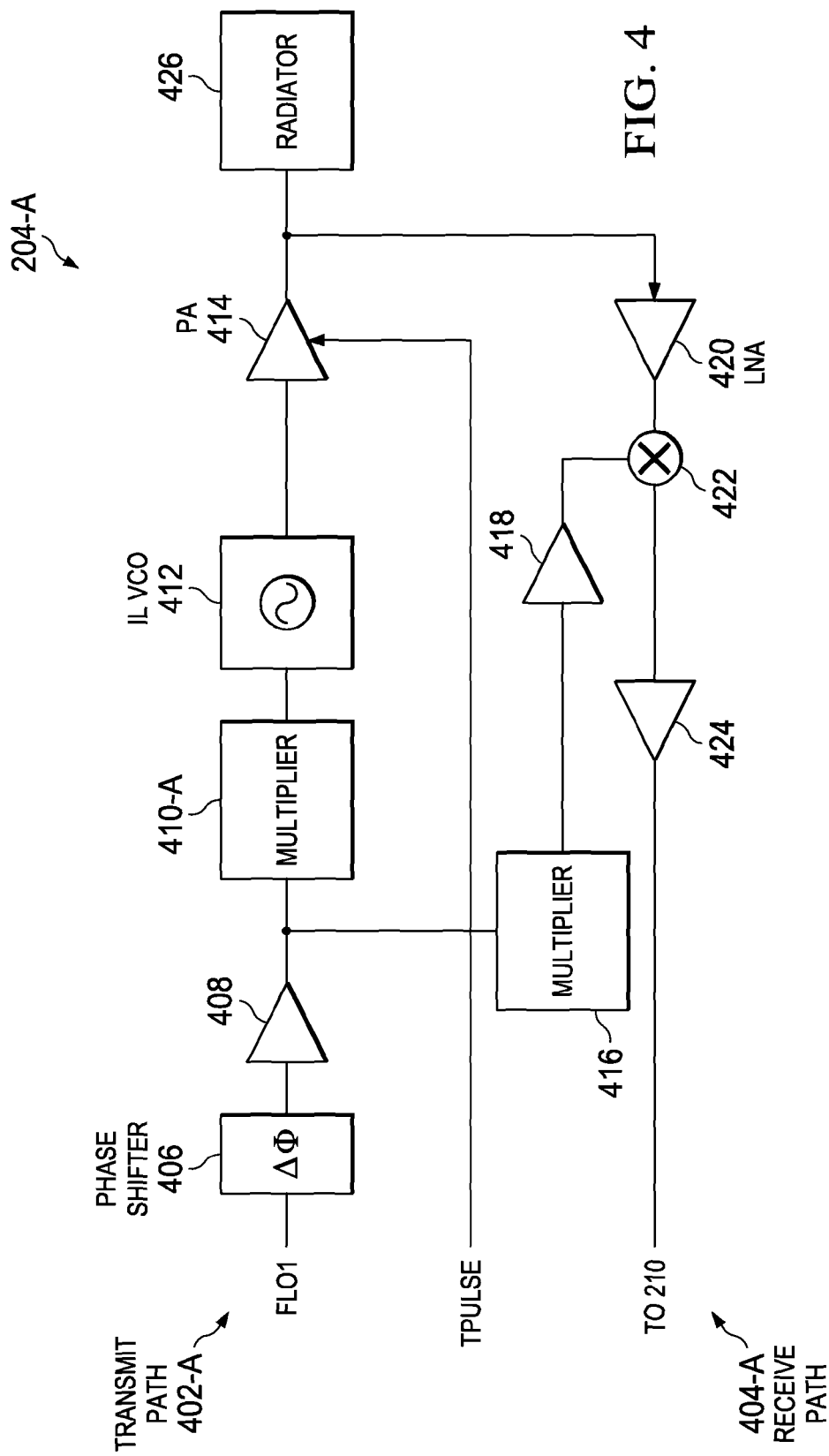
FIG. 4-7 are block diagrams of examples of the transceivers of FIG. 2.

In FIG. 4, an example of one of transceivers 202-1 to 202-N (referred to as 202-A) can be seen in greater detail. As shown, transceiver 202-A generally includes a transmit path 402-A and a receive path 404-A that are each coupled to radiator 426 (i.e., antenna). During transmission, phase shifter 404 (which is generally controlled by controller 230) receives signal FL01 from LO 202 and phase-shifts signal FL01 accordingly. This phase shifted signal is amplified by amplifier 408 and multiplied by multiplier 410-A (which is typically a multiply-by-3 multiplier) that allows the signal FL01 to be increase to the desired frequency range. For example, if signal FL01 is about 67 GHz, then multiplier 410-A would output a signal having a frequency of about 201 GHz. This multiplied signal is provided to ILVCO 412, which is generally used to compensate for losses from multiplier 410-A. Additionally, ILVCO 412 receives the pulse signal TPULSE. Power amplifier (PA) 414 then amplifies the output of ILVCO 412 for transmission through radiator 426. Typically, the pulse widths of pulse signal TPULSE are about 30 ps, 60 ps, or 90 ps when the signal FL01 has a frequency of about 67 GHz. During reception, radiator 426 receives a signal, which is amplified by amplifier 420. This amplified signal is mixed with a signal having a frequency that is a multiple of signal FL01. Typically, multiplier 416 (which is generally a multiply-by-2 multiplier) receives an output from amplifier 408, and the result is amplified by amplifier 418 and provided to mixer 422. The mixed output is then amplified by amplifier 424 and provided to summing circuit 210. Additionally, mixer 422 is described in co-pending of U.S. patent application Ser. No. 12/871,626 entitled "DOWNCONVERSION MIXER."

Figure 5:
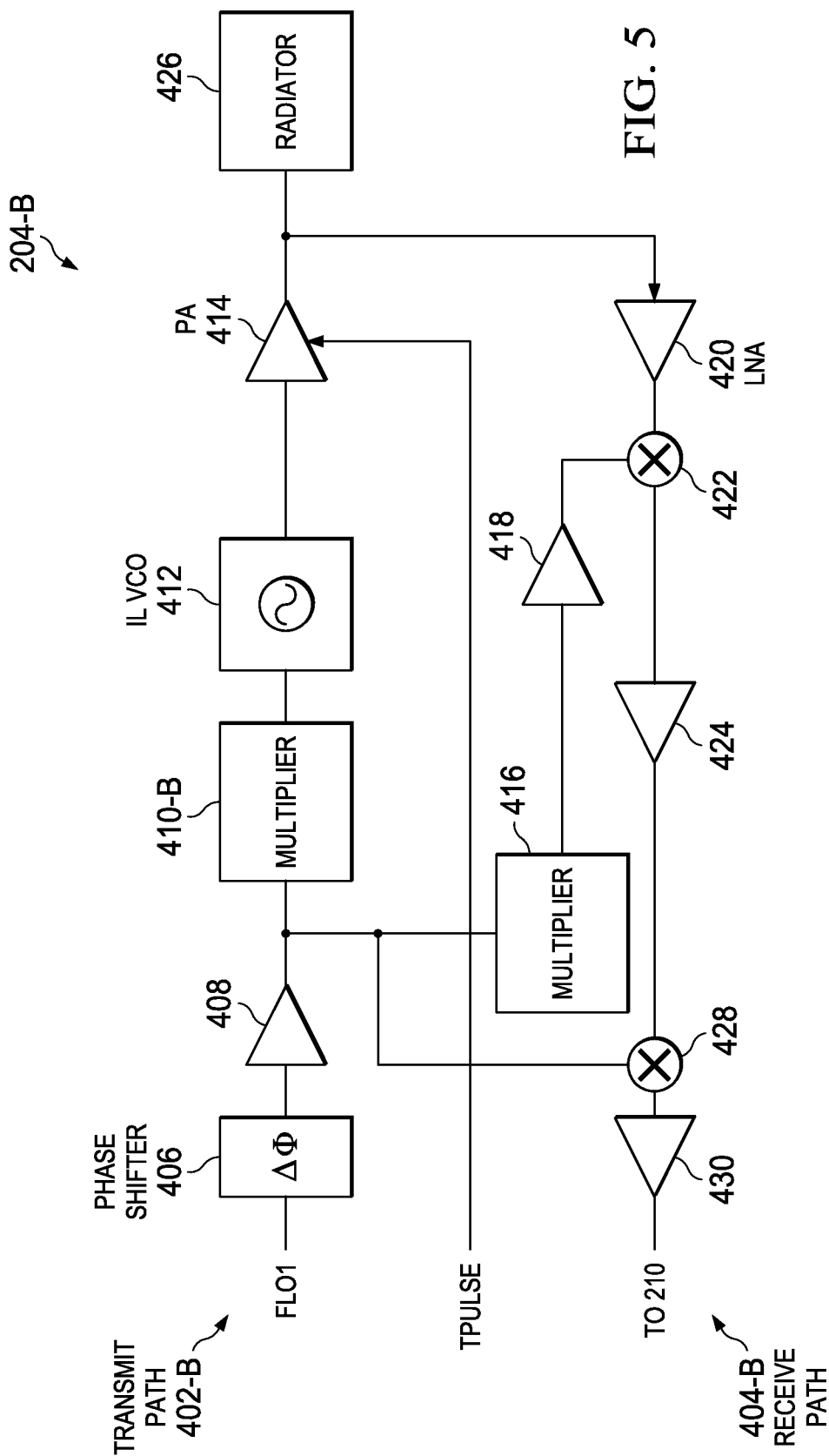

Looking to FIG. 5, an alternative configuration for one of transceivers 202-1 to 202-N (referred to as 202-B) can be seen in greater detail. The transmit path 402-B is similar to transmit path 402-A; however, multiplier 410-B has replaced multiplier 410-B. Generally, multiplier 410-B has a large range than multiplier 410-B to accommodate a lower frequency signal FL01. For example, if signal FL01 has a frequency of 50 GHz, then multiplier 410-B can be a multiply-by-4 multiplier to generate a signal that is on the order of 200 GHz. Additionally, to accommodate a lower frequency signal FL01, receive path 404-B includes a mixer 428 that mixes the outputs of amplifiers 424 and 408 and an amplifier 430. Also, the pulse widths of pulse signal TPULSE can be about 40 ps or 80 ps when the signal FL01 has a frequency of about 50 GHz.

Figure 6:
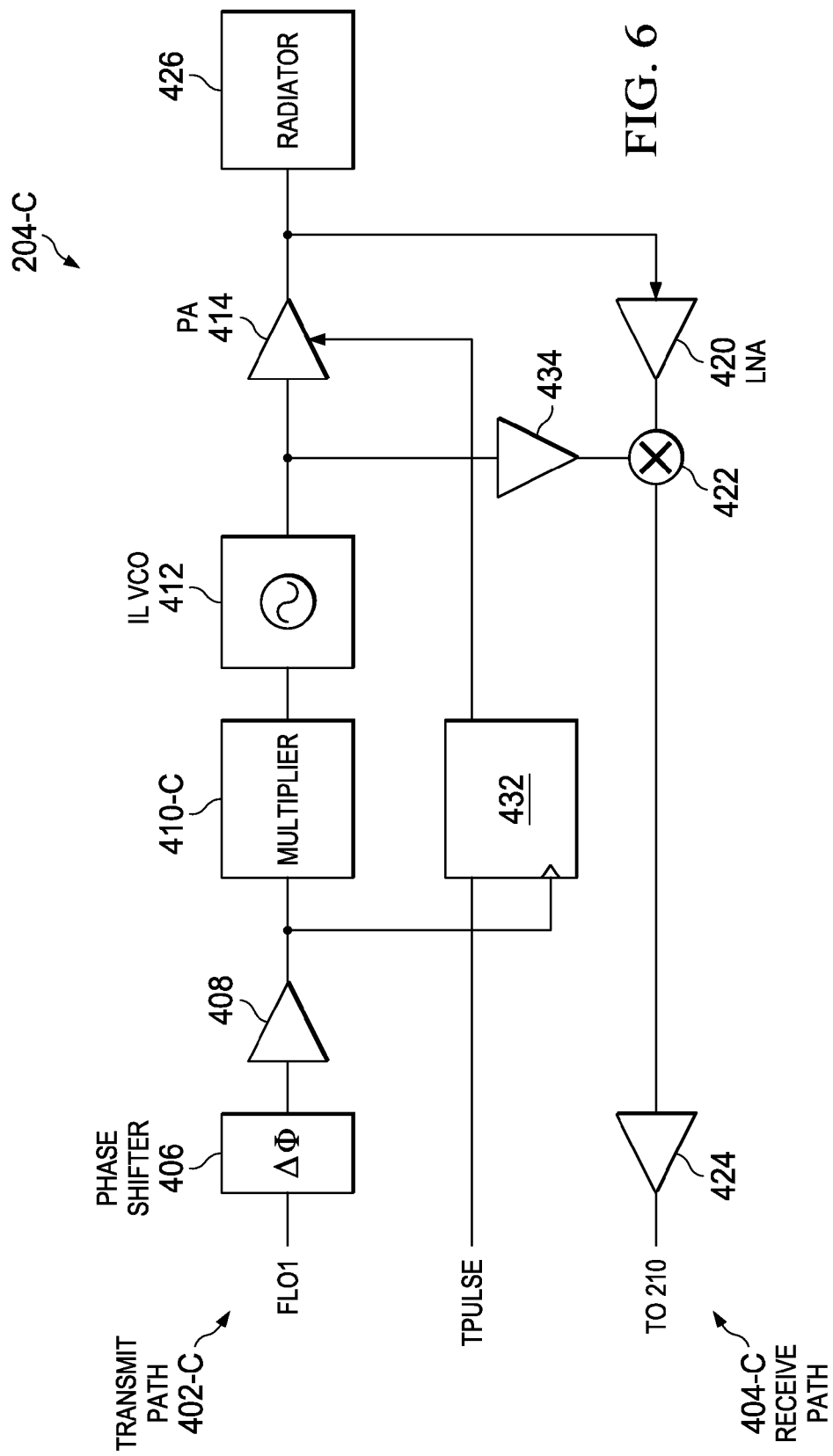

Turning to FIG. 6, yet another alternative one of transceivers 202-1 to 202-N (referred to as 202-C) can be seen in greater detail. Here, D flip-flop 432 has been included in the path for the pulse signal TPULSE; namely, the input terminal of flip-flop 432 receives the pulse signal TPULSE, while flip-flop is clocked by the output of amplifier 408. Additionally, multiplier 416 and amplifier 418 have been replaced by amplifier 434. This arrangement is generally useful for even lower frequency ranges (i.e., 40 GHz), which can produce pulse widths for pulse signal TPULSE are about 50 ps or 100 ps.

Figure 7:
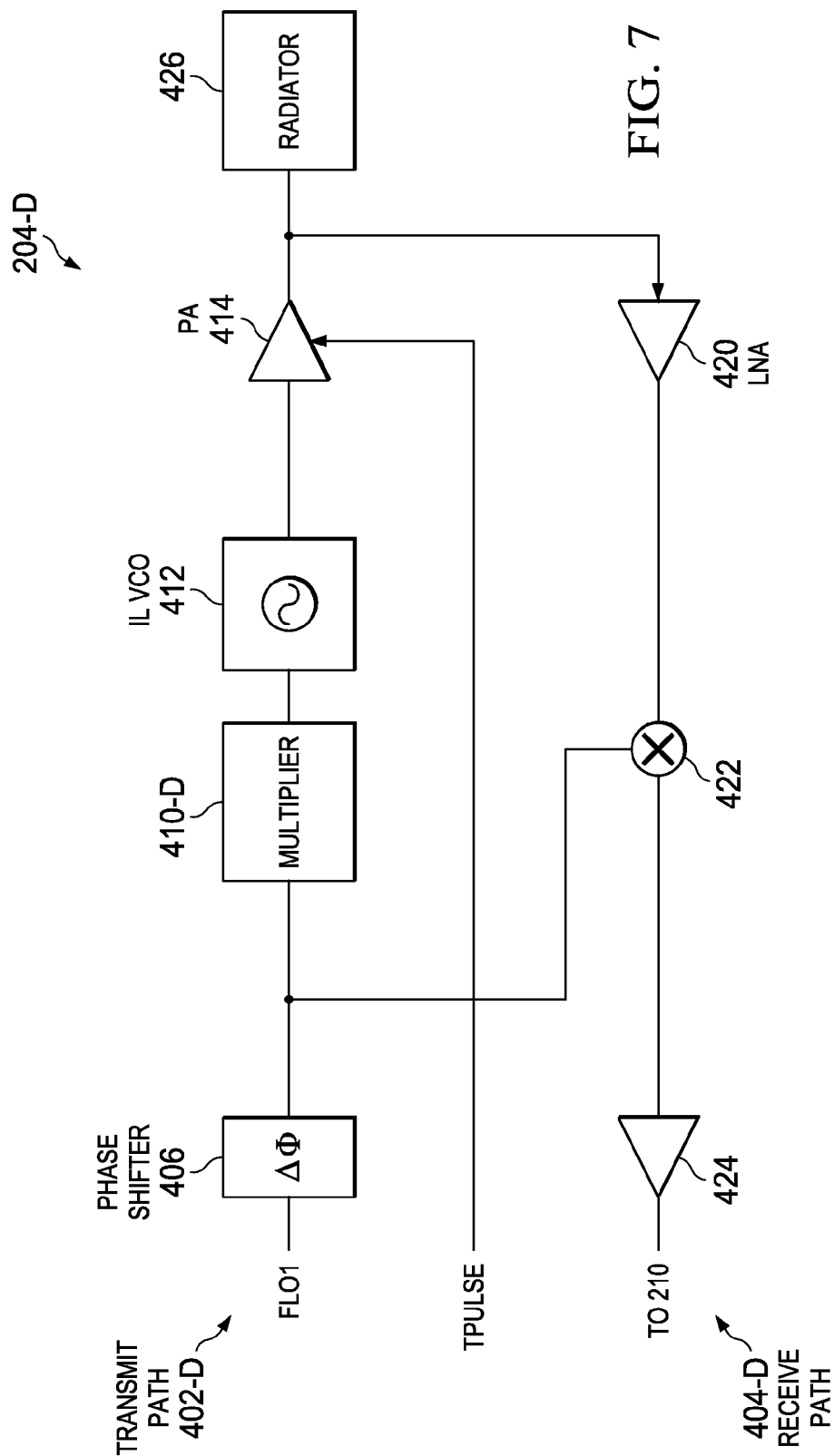

In FIG. 7, another alternative one of transceivers 202-1 to 202-N (referred to as 202-D) can be seen in greater detail. Here, the transmit path 402-D is similar to path 204-A; however, multiplier 410-A has been replaced with multiplier 410-D, while amplifier 408 has been removed. Multiplier 410-D generally has a lower range to accommodate a signal FL01 with a high frequency. For example, if signal FL01 has a frequency of about 100 GHz, then multiplier 410-D can be a multiply-by-2 multiplier. Additionally, for receive path 404-D, multiplier 416 and amplifier 418 have been removed so that mixer 422 mixes the output of LNA 420 with the output of phase shifter 406.

Figure 8:
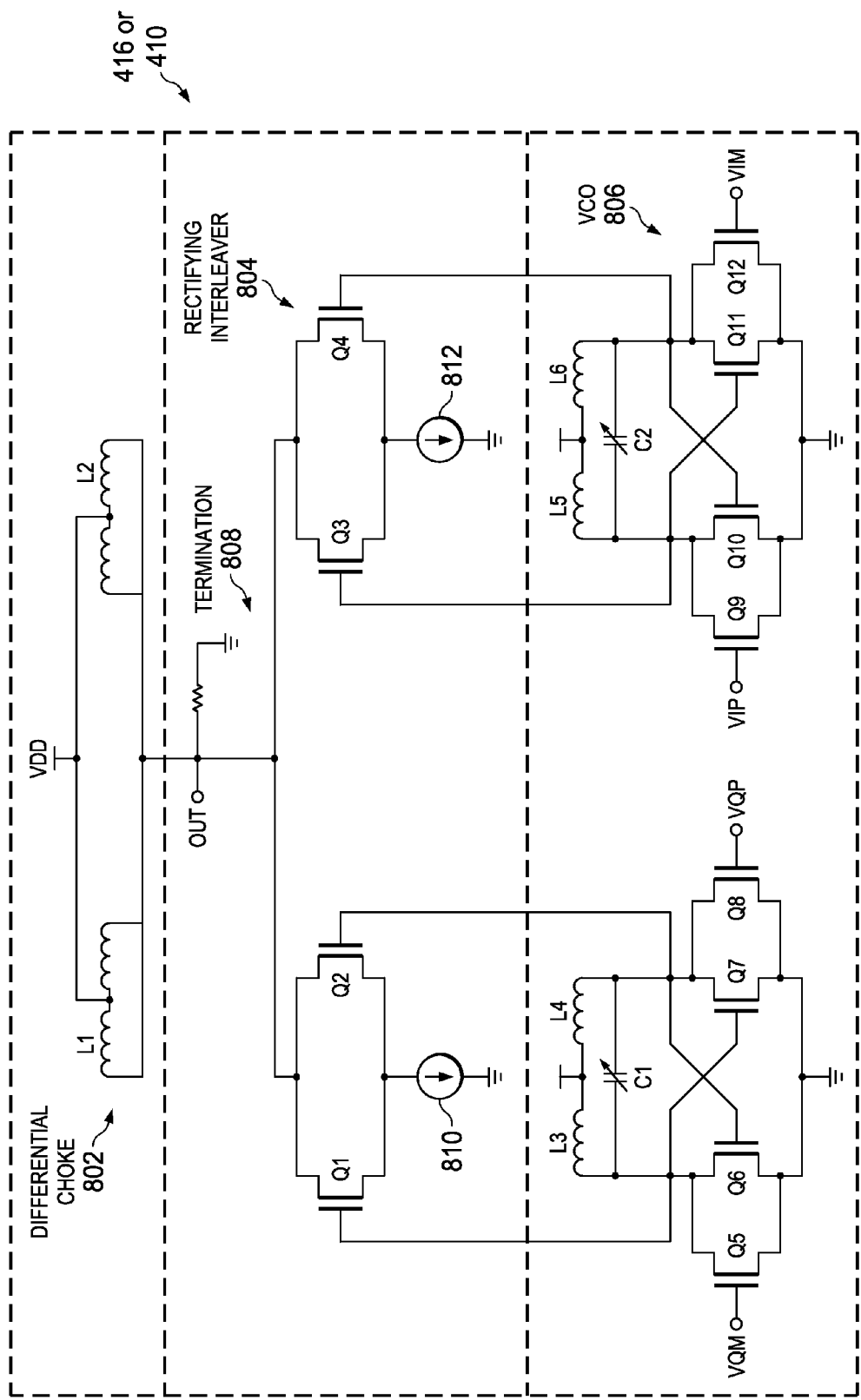
FIG. 8 is a circuit diagram of an example of the multipliers of FIGS. 4-7.

Turning now to FIG. 8, a circuit diagram of an example of multipliers 410 and/or 416 can be seen. This type of multiplier 410 and/or 416 is generally employed within transceivers 202-1 to 202-N to produce very high frequencies (i.e., 200 GHz) because direct production of these high frequency signals is very difficult. Generally, multiplier 410 and/or 416 employs a differential choke 802, a rectifying interleaver 804, and a VCO 806. Typically, VCO 806 uses two oscillator tanks to generate two pairs of output signals from differential in-phase signals VIP and VIM and differential quadrature signals VQM and VQP. Typically, VCO 806 comprises MOS transistors Q5 through Q12, inductors L3 through L6, and capacitors C1 and C2. Rectifying interleaver 804 employs two differential pairs of transistors Q1/Q2 and Q3/Q4 and current sources 810 and 812 to interleave the outputs from VCO 806 to generate a single-ended output signal OUT. Additionally, a termination 808 and inductors L1 and L2 (from differential choke 802) are coupled to the rectifying interleaver 804. Typically, power output is sufficient to lock ILCVO 412 (i.e., −20 bBm).

Figure 9:
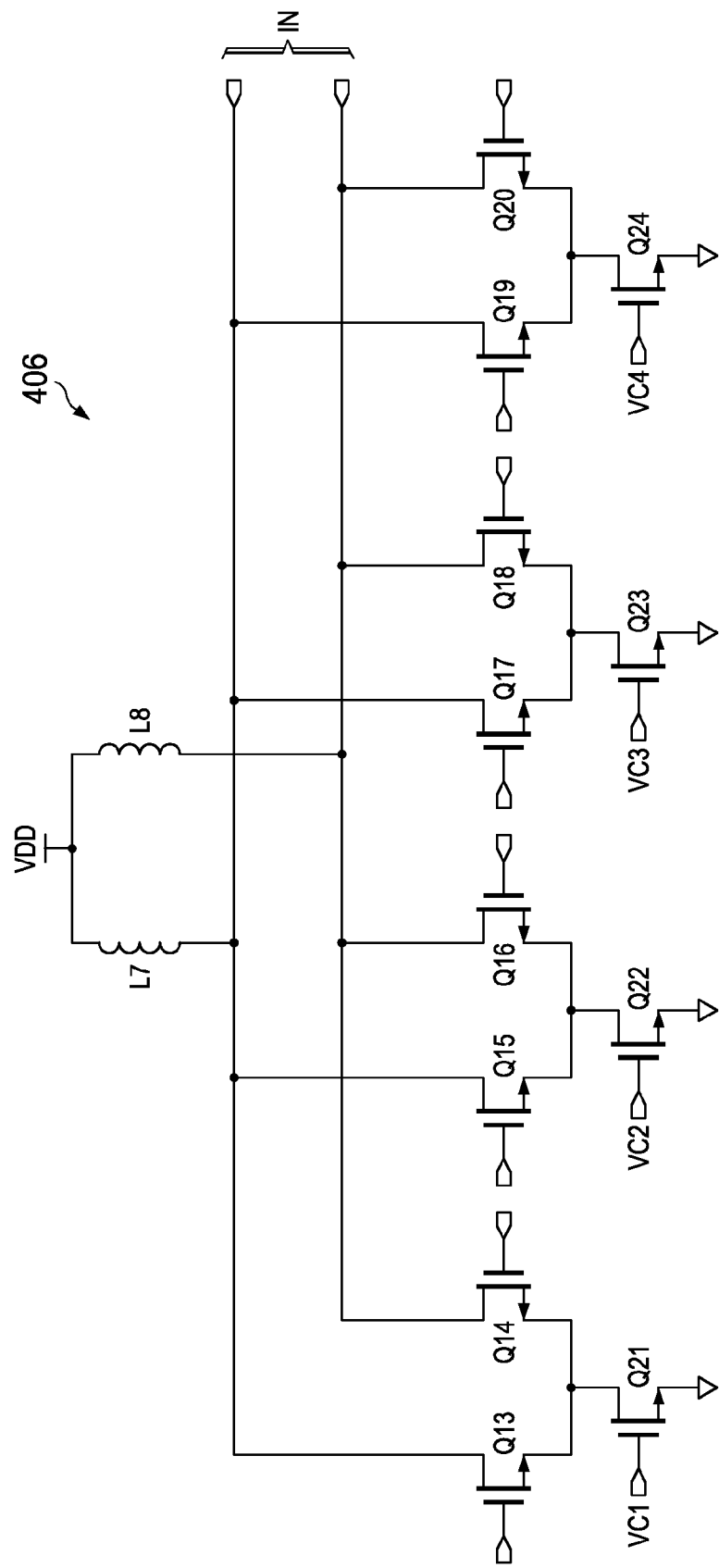
FIG. 9 is a circuit diagram of an example of the phase shifters of FIGS. 4-7.

In FIG. 9, an example of phase adjuster 406 can be seen. Here, a differential input signal IN (which is generally signal FL01 from LO 202) is provided to differential pairs of MOS transistors Q13/14, Q15/Q16, Q17/Q18, and Q19/Q20 (which are also coupled to inductors L7 and L8). Based on control signals VC1 through VC4 received from controller 236, transistors Q21 through Q24 can activate the differential pairs Q13/14, Q15/Q16, Q17/Q18, and Q19/Q20 to generate a phase rotation of the differential input signal IN, having a total phase shift range of less than about ±22.5°. Typically, phase shifting is performed in the lower frequency domain (i.e., 50 GHz) to generally ease any bandwidth requirements and efficiently recover power losses.

Figure 10:
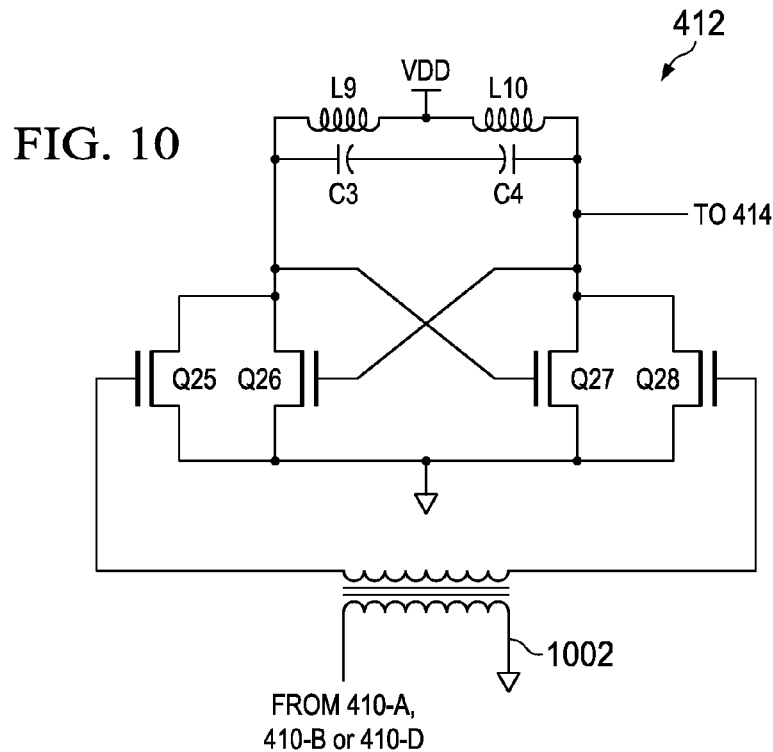
FIG. 10 is a circuit diagram of an example of the injection locked voltage controlled oscillator (ILVCO) of FIGS. 4-7.

Turning to FIG. 10, a circuit diagram of an example of ILVCO 412 can be seen. ILVCO 412 is generally employed because of the losses from multiplier 410. Theoretically, ILVCO 412 can provide an infinite gain if the center frequencies match with a finite gain throughout the locking range. Typically, MOS transistors Q25 and Q28 are coupled at their respective gates to balun 1002, which receives an output from multiplier 410 (i.e., 410-A, 410-B, or 410-C). In an alternative configuration, MOS transistor Q28 can receive receives an output from multiplier 410 (i.e., 410-A, 410-B, or 410-C) at its gate, while MOS transistor Q28 receives the pulse signal TPULSE at its gate. These transistors Q25 and Q28 are generally coupled in parallel to a gain stage (which is generally comprised of cross-coupled MOS transistors Q26 and Q27) and the oscillator tank (which is generally comprised of capacitors C3 and C4 and inductors L9 and L10). Alternatively, the second harmonic of the output can be used instead of first harmonic to relax any tuning range requirements, but with reduced output power. As an illustration, the properties of ILVCO 412 can be seen in Table 1 below using both the first and second harmonics.

TABLE 1

| Targets | First Harmonic | Second Harmonic |
| --- | --- | --- |
| Input Frequency [GHz] | 200 | 100 |
| Output Frequency [GHz] | 200 | 200 |
| Power Output [dBm] | −12 | −12 |
| Phase locking | @200 GHz | @100 GHz |

Figure 11:
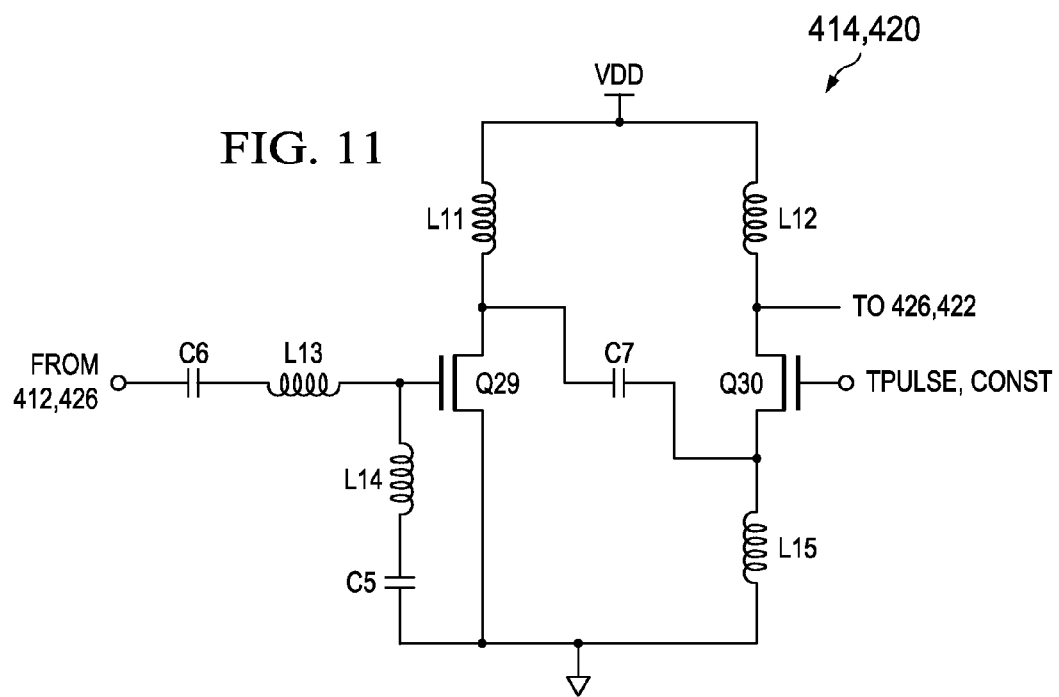
FIG. 11 is a circuit diagram of an example of the power amplifier (PA) and low noise amplifier (LNA) of FIGS. 4-7.

In FIG. 11, a circuit diagram for an example of PA 414 and/or LNA 420 can be seen. Generally, the PA 414 and/or LNA 420 can provide linear amplification and isolation, and one of the features of PA 414 and/or LNA 420 is its ability to be power gated with a fast pulse time (i.e., tens of picoseconds). PA 414 and/or LNA 420 generally comprise inductors L11 through L15, capacitors C5 through C7, and transistors Q29 and Q30. Here, the capacitors C5 through C7 are resonated by series or shunt inductors L11 through L15 to provide the amplification with transistors Q29 and Q30. Additionally, the input and output of PA 414 and/or LNA 420 can be matched input or output impedances. For example, for PA 414, the output impedance can be matched to the radiator 426. Moreover, the circuit shown in FIG. 11 can be cascaded in multiple stages, where the gain can be between 0 and 2 dB per stage.

Figure 12:
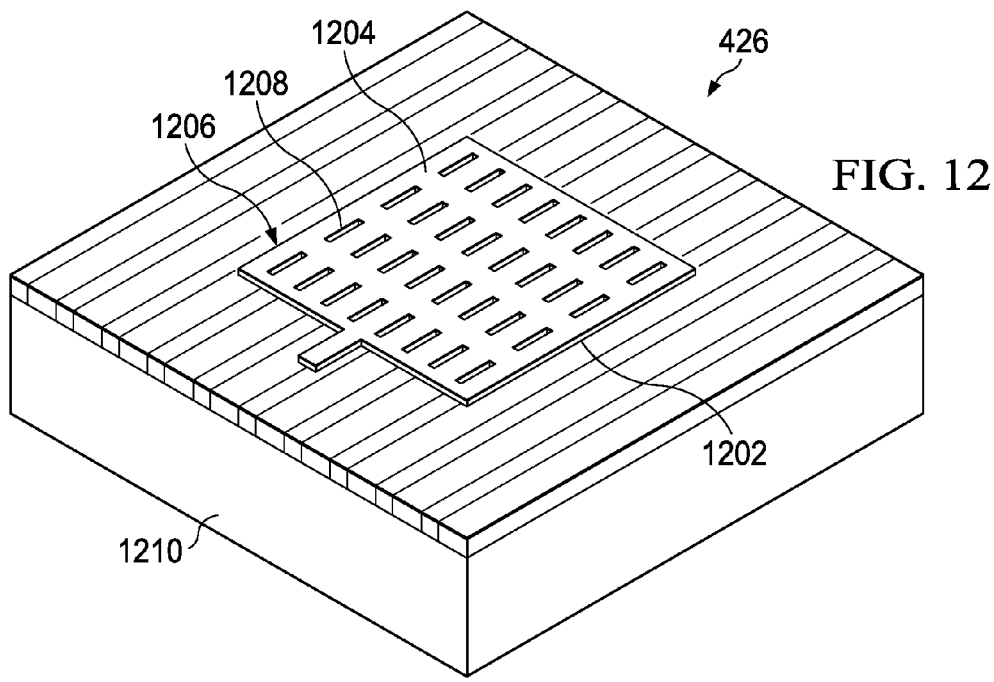
FIG. 12 is block diagram of an example of the radiator of FIGS. 4-7.
Figure 13:
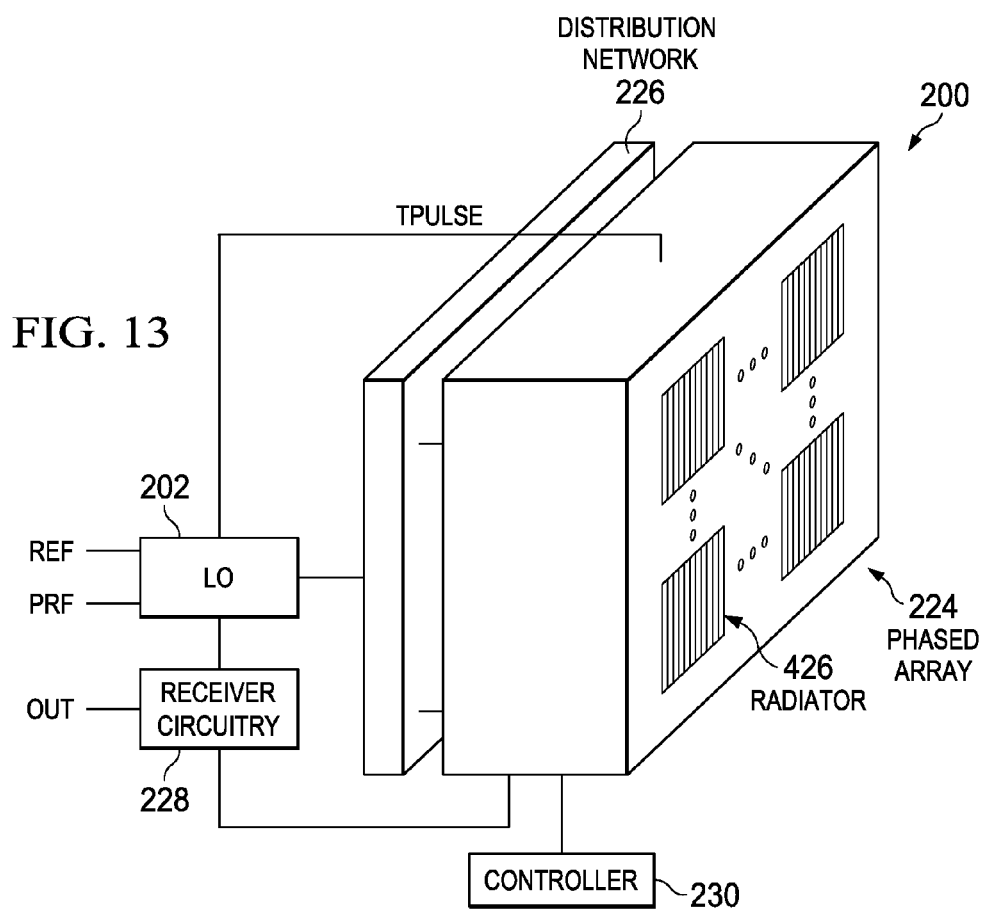
FIG. 13 is a block diagram of the phased array system of FIG. 2.

Turning to FIG. 12, an example of a radiation 426 can be seen. Here, radiator 426 is shown as being a patch antenna formed over a substrate 210. This patch antenna generally comprises a patch 1204 having slots 128 that are generally parallel to ground strips and radiating edges 1202. For a frequency of about 410 GHz (which has a wavelength of about 0.75 mm in air), the width W and length L of patch 1204 are each about 200 μm, while the slots are 2 μm wide. The proportions of the patch antenna can then be varied so as to accommodate a desired emission frequency (and wavelength). These radiators 426 (i.e., patch antennas) can then be formed into an array as shown in FIG. 13. Alternatively, radiator 426 can be a bondwire Yagi-Uda antenna.

Figure 14:
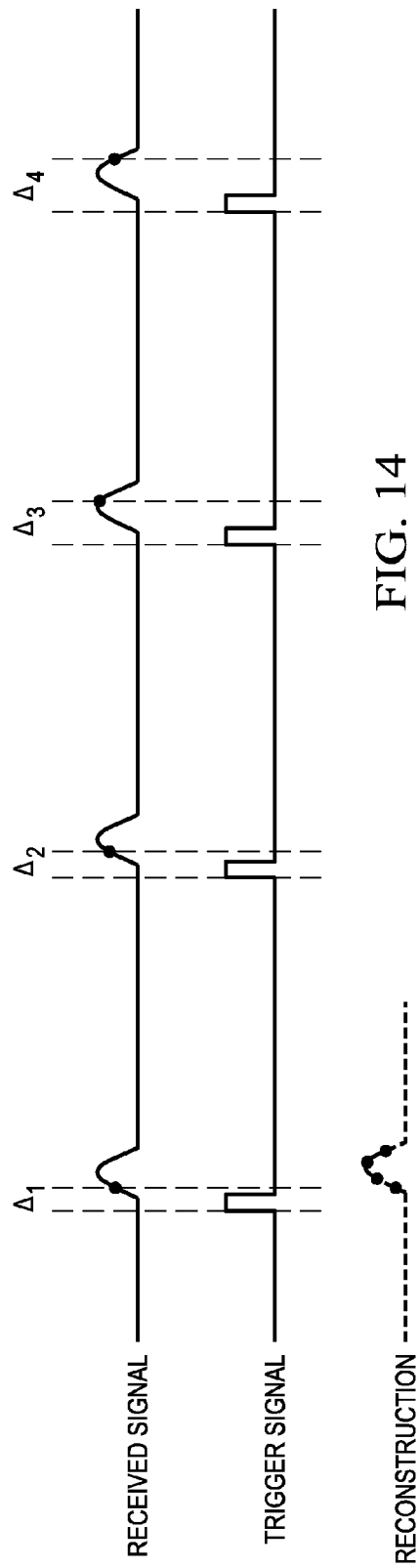
FIGS. 14 and 15 are timing diagrams that depict examples of the operation of the phased array system of FIG. 2.
Figure 15:
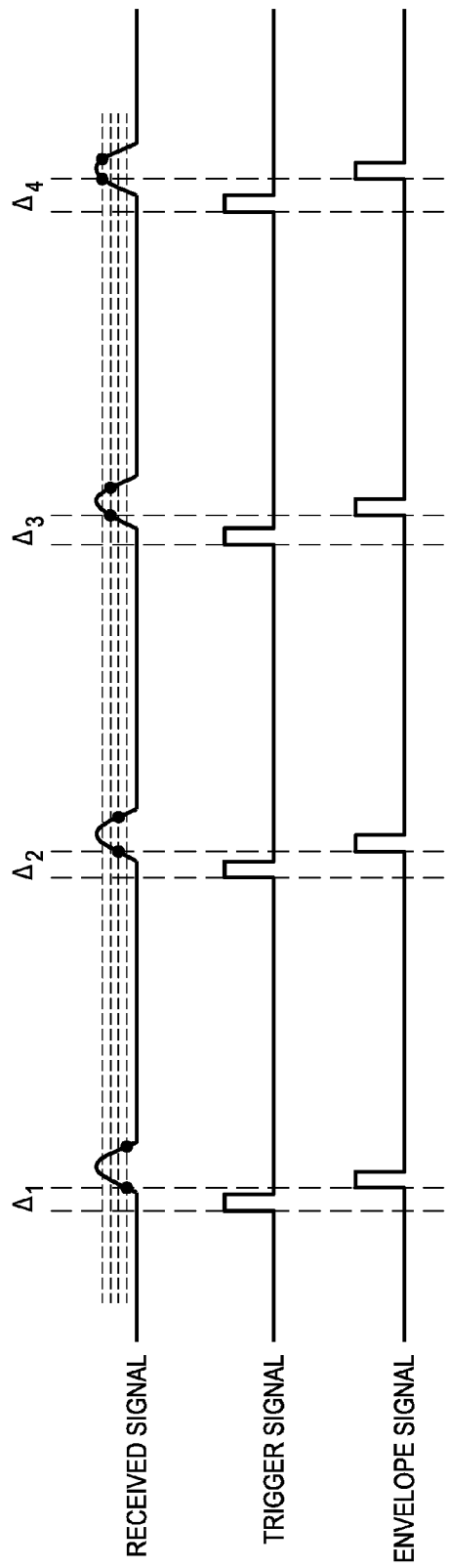

Because the data bandwidth of system 200 is very high (i.e., on the order of tens of gigahertz), it is generally impractical to employ an ADC that digitizes the signals receives through by the receiver circuitry 228. In FIGS. 14 and 15, timing diagrams can be seen that generally depict the operation of the receiver circuitry 228, where each uses a trigger signal to reconstruct the received signal. For FIG. 14, variable selector 220 actuates switches 218-1 to 218-N at various periods (i.e., $\Delta_1$ to $\Delta_4$) following the trigger signal to allow each of the ADCs 222-1 to 222-N to resolves a portion of the received signal. FIG. 15, on the other hand, use an envelop signal following the periods (i.e., $\Delta_1$ to $\Delta_4$) as part of the control mechanism for switches 218-1 to 218-N.

Figure 16:
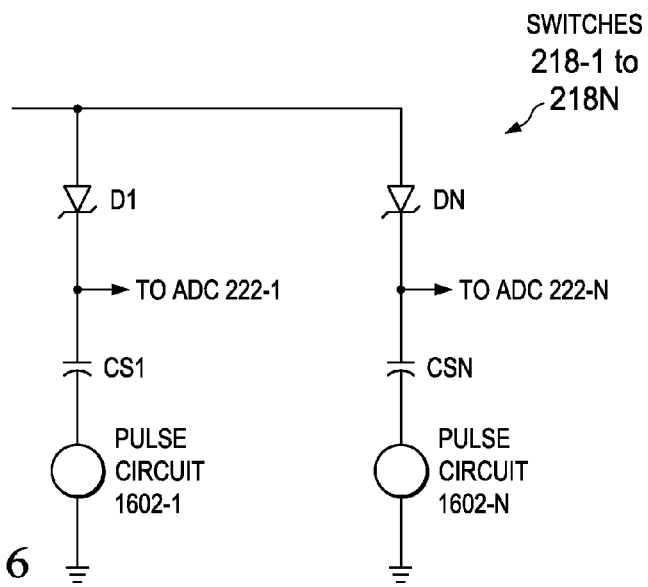
FIG. 16 is a circuit diagram of an example of the switches of FIG. 2.

To accomplish this, there are several approaches that can be taken. In FIG. 16, an example for one arrangement can be seen. In this arrangement, the switches 218-1 to 218-N are comprised of zener diodes D1 to DN, capacitors CS1 to CSN, and pulse circuits 1602-1 to 1602-N (which are generally controlled by the variable selector 220). These switches 218-1 to 218-N operate as an input sampling network where each capacitor CS1 to CSN is coupled to a "slow" ADC 222-1 to 222-N. Generally, this approach may require very small apertures and very accurate clock generation.

Figure 17:
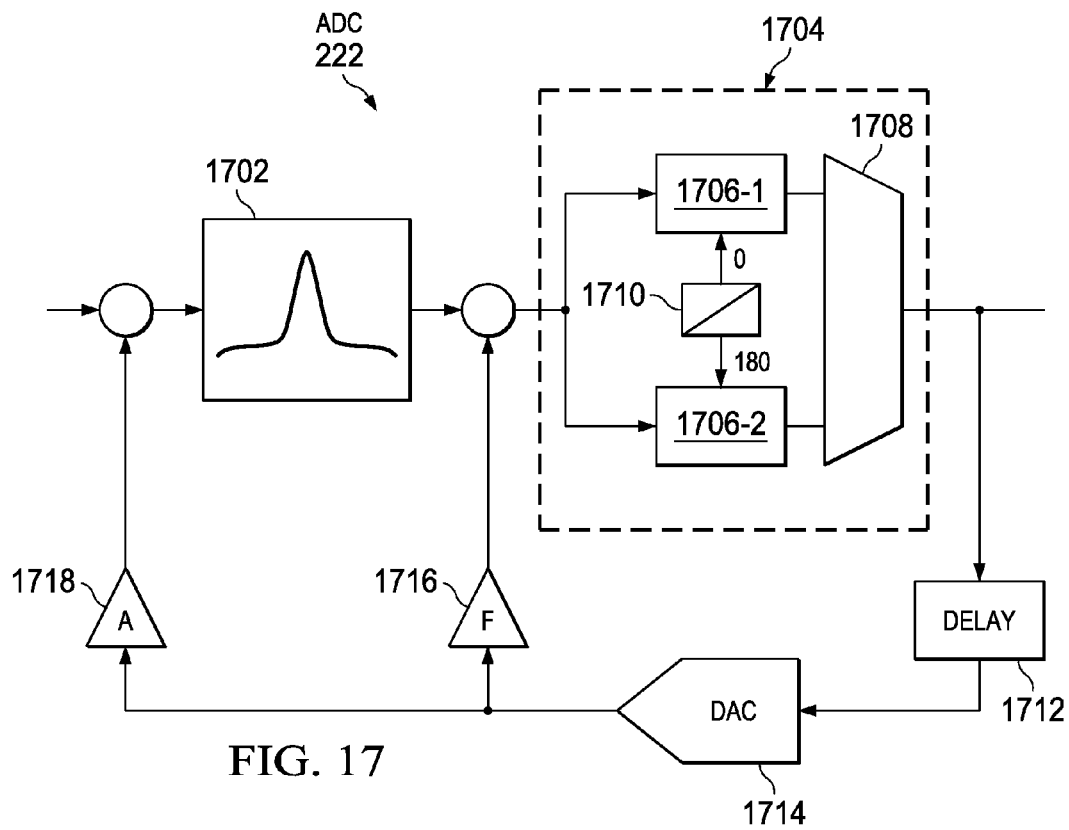
FIG. 17 is a circuit diagram of an example of the analog-to-digital converters (ADCs) of FIG. 2.

Another arrangement can be seen in FIG. 17. For this arrangement, ADCs 222-1 to 222-N (referred to as 222) are low pass/band pass sigma-delta converters that can directly digitize about a 10 GHz bandwidth with a clock of about 100 GHz. ADC 222 generally comprises a filter 1702, a quantizer 1704, a delay 1712, a digital-to-analog converter (DAC) 1714, and amplifiers 1716 and 1718. The quantizer 1704 generally comprises quantizers 1706-1 and 1706-2, clock divider 1710, and multiplexer 1708. In operation, a feedback signal (which is amplified by amplifier 1718) is combined with the input signal and filtered by filter 1702. This filtered output is combined with the feedback signal (which is amplified by amplifier 1716). Quantizer 1704 (which is generally an 2-bit, 2-way interleaved quantizer operating at 1.5 GHz) quantizes the signal (which is then delayed by delay 1712 and converted to a feedback signal by DAC 1714).

Figure 18:
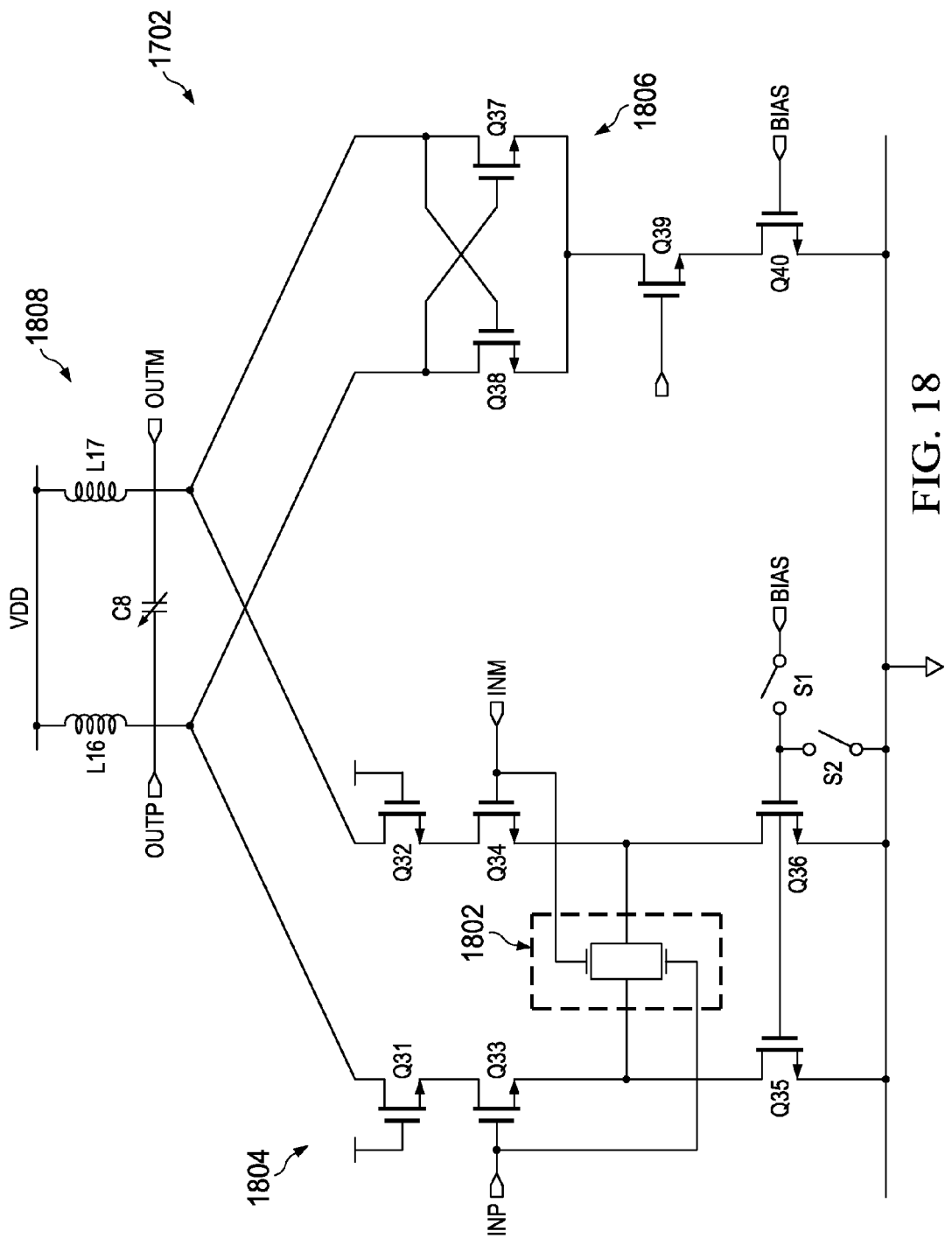
FIG. 18 is a circuit diagram of the low pass/band pass filter of FIG. 17.

The filter 1702 can be seen in greater detail in FIG. 18. In particular, the filter 1702 operates as amplifier and LC filter. To accomplish this, filter 1702 generally comprises a transconductor cell 1804 (which generally comprises transistors Q31 through Q36, linearizer 1802 and switches 51 and S2) and a negative transconductor cell 1806 (which generally comprises transistors Q37 through Q40) that are each coupled to an LC circuit 1808 (which generally comprises inductors L16 and L17 and capacitor C8).

Figure 19A:
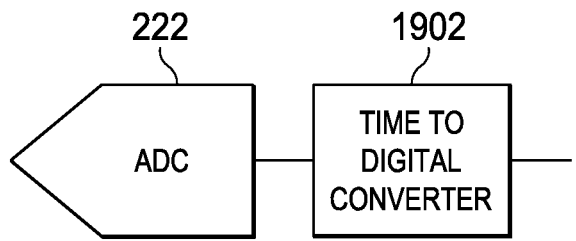
FIGS. 19A and 19B are circuit diagrams of an example of a time to digital converter used with the ADCs of FIG. 2.
Figure 19B:
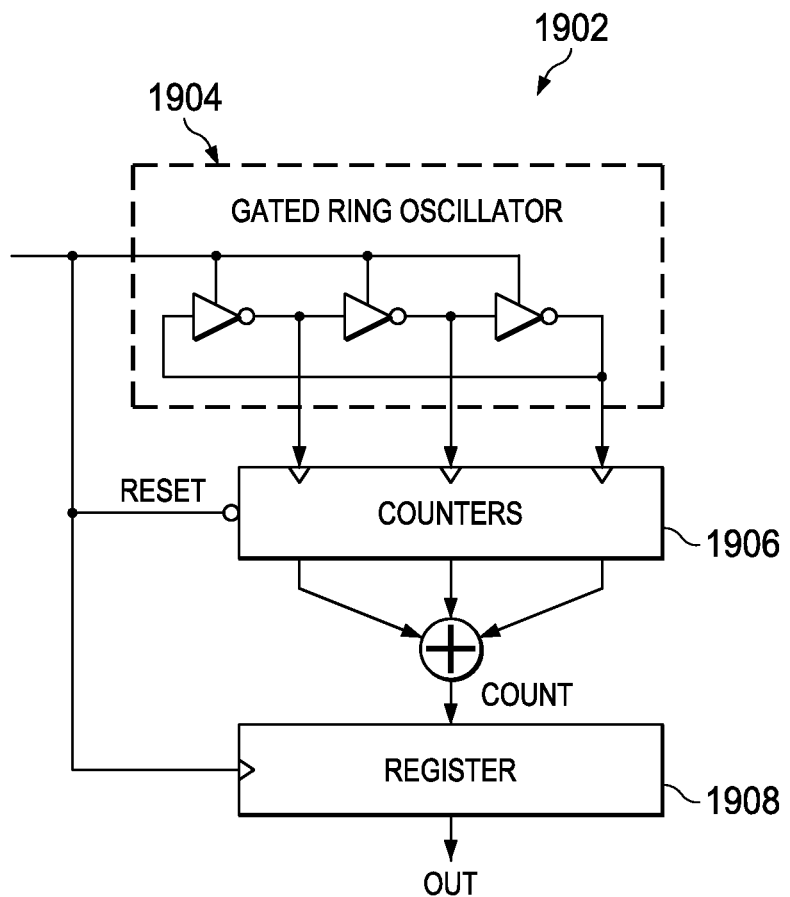
Figure 19C:
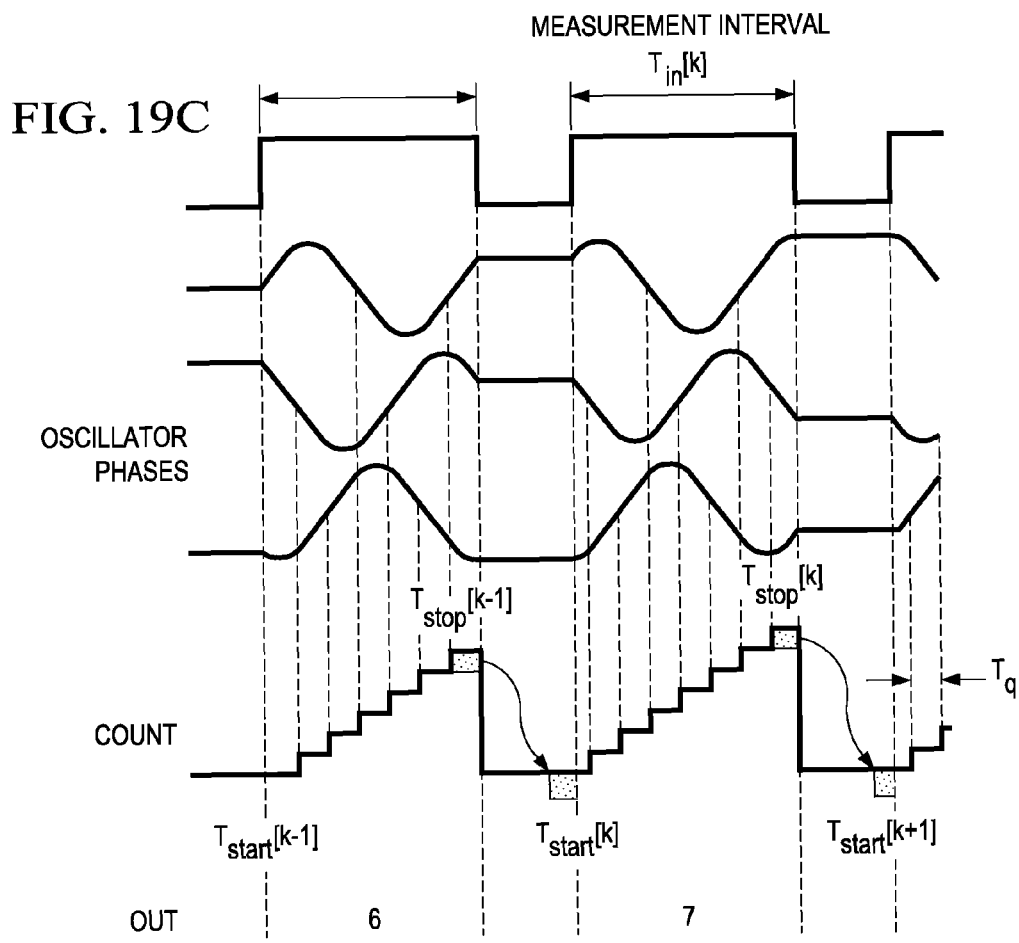
FIG. 19C is a timing diagram depicting an example of the operation of the time to digital converter of FIGS. 19A and 19B.

Yet another approach can be seen in FIGS. 19A, 19B, and 19C. Here, a time to digital converter 1902 is coupled to each ADC 222-1 to 222-N; only one ADC, labeled 222, is shown, however. This converter 1902 has sub-picosecond resolution and, in operation, enabled when the input signal transitions to logic high or "1." This activates the gated ring oscillator 1904 so that the counters 1906 can performed counting operations from the taps of the oscillator 1904. The outputs from the counters 1904 can then be summed and stored in register 1904.

Figure 20:
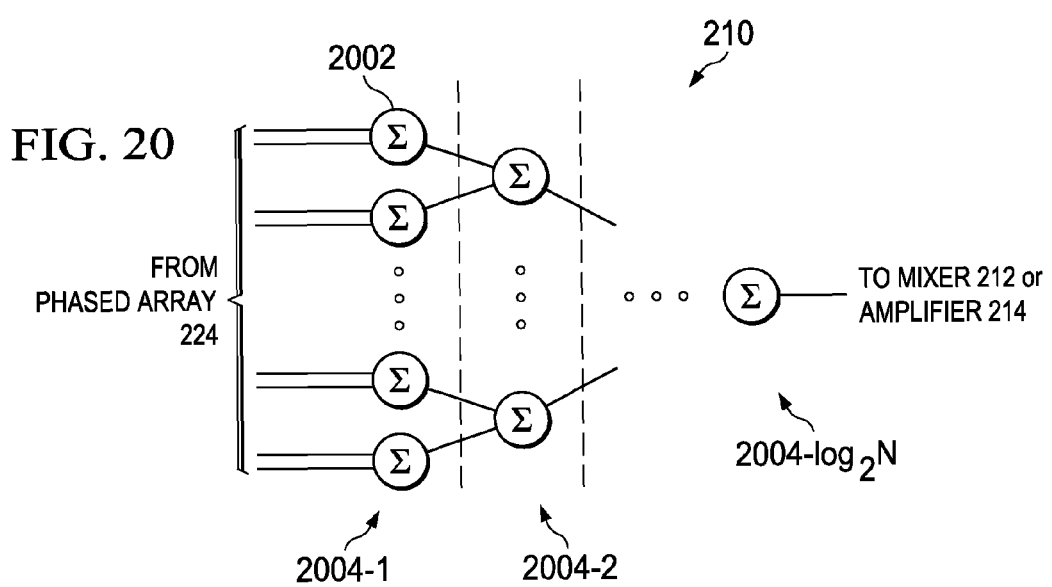
FIG. 20 is a circuit diagram of an example of the summing circuit for the receiver circuitry of FIG. 2.

Turning to FIG. 20, a circuit diagram of an example of summing circuit 210 can be seen. Typically, summing circuit 210 is a summing amplifier that is formed as a summing amplifier tree. As shown in FIG. 20, each summing circuit or summing amplifier 2002 receives a pair of input signals. At the first stage 2004-1 of the tree each summing circuit 2002 is coupled to a pair of transceivers (i.e., 204-1 and 204-1). Then each subsequence stage (i.e., 2004-2) receives input signals from a pair of summing circuits 2002 from the previous stage (i.e., 2004-1). As a result the tree has a depth of $\log_2 N$, where N is the number of transceivers 204-1 to 204-N.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a local oscillator that generates a local oscillator signal and a pulse signal;
   a distribution network that is coupled to the local oscillator so as to at least distribute the local oscillator signal;
   a plurality of transceivers, wherein each transceiver has a radiator, a transmit path that is coupled to the radiator, and a receive path that is coupled to the radiator, and wherein the transmit path for each transceiver includes:
      a phase shifter is coupled to the distribution network so as to receive the local oscillator signal;
      a multiplier that is coupled to the phase shifter so as to receive a phase shifted local oscillator signal;
      a injection-locked voltage controlled oscillator (ILVCO) that is coupled to the multiplier; and
      a power amplifier (PA) that is coupled to the ILVCO and that receives the pulse signal; and
   receiver circuitry that is coupled to the receive path for each of the transceivers.

2. The apparatus of claim 1, wherein the local oscillator signal further comprises a first local oscillator signal, and wherein the local oscillator further comprises:
   a phase locked loop (PLL) that receives a reference signal and that generates the first oscillator signal and a second local oscillator signal;
   a counter that receives a control signal and that is coupled to the PLL; and
   a pulse generator that is coupled to the counter and the PLL, wherein the pulse generator generates the pulse signal based at least in part on the second local oscillator signal and an output from the counter.

3. The apparatus of claim 2, wherein the PLL further comprises:
   a phase detector that receives the reference signal;
   a charge pump that is coupled to the phase detector;
   a low pass filter that is coupled to the charge pump;
   a voltage controlled oscillator (VCO) that is coupled to the low pass filter;
   an amplifier that is coupled to the VCO; and
   a plurality of dividers that are coupled in series with one another between the VCO and the phase detector.

4. The apparatus of claim 2, wherein the transmit path for each transceiver further comprises an amplifier that is coupled between the phase shifter and the multiplier.

5. The apparatus of claim 4, wherein the ILVCO further comprises:
   a first node;
   a second node;
   an inductive network that is coupled between the first and second nodes;
   a capacitive network that is coupled between the first and second nodes;
   a first MOS transistor that is coupled to the first node at its source or its drain and to the second node at its gate;
   a second MOS transistor that is coupled to the second node at its source or its drain and to the first node at its gate;
   a third MOS transistor that is coupled generally in parallel to the first MOS transistor;
   a fourth MOS transistor that is coupled generally in parallel to the second MOS transistor; and
   a balun that is coupled to the amplifier and that is coupled to the gates of the third and fourth MOS transistors.

6. The apparatus of claim 5, wherein the PA further comprises:
   a first capacitor that receives an output from the ILVCO;
   a first inductor that is coupled to the first capacitor;
   a second inductor that is coupled to the first inductor;
   a second capacitor that is coupled to the second inductor;
   a third inductor;
   a fifth MOS transistor that is coupled to the first and second inductor at its gate and that is coupled to the third inductor;
   a fourth inductor;
   a fifth inductor;
   a sixth MOS transistor that receives the pulse signal at its gate and that is coupled between the fourth and fifth inductors; and
   a third capacitor that is coupled between the third and fifth inductors.

7. The apparatus of claim 4, wherein the amplifier further comprises a first amplifier, and wherein the multiplier further comprises a first multiplier, and wherein the receive path for each transceiver further comprises:
   a low noise amplifier (LNA) that is coupled to the radiator;
   a second multiplier that is coupled to the first amplifier;
   a second amplifier that is coupled to second multiplier;
   a mixer that is coupled to the LNA and the second amplifier; and
   a third amplifier that is coupled to the mixer.

8. The apparatus of claim 7, wherein the mixer further comprises a first mixer, and wherein the receive path for each transceiver further comprises:
   a second mixer that is coupled to the first and third amplifiers; and
   a fourth amplifier that is coupled to the second mixer.

9. The apparatus of claim 4, wherein the amplifier further comprises a first amplifier, and wherein the transmit path for each transceiver further comprises a flip-flop that receives the pulse signal and that is coupled to the first amplifier, the ILVCO, and the PA, and wherein the multiplier further comprises a first multiplier, and wherein the receive path for each transceiver further comprises:
   an LNA that is coupled to the radiator;
   a second amplifier that is coupled to the ILVCO;
   a mixer that is coupled to the LNA and the second amplifier; and
   a third amplifier that is coupled to the mixer.

10. The apparatus of claim 1, wherein each phase shifter further comprises:
a first input terminal;
a second input terminal;
a first inductor that is coupled to the first input terminal;
a second inductor that is coupled to the second input terminal; and
a plurality of phase shifters, wherein each phase shifter includes:
a first MOS transistor that is coupled to the first input terminal at its drain;
a second MOS transistor that is coupled to the second input terminal at its drain; and
a third MOS transistor that is coupled to the sources of the first and second MOS transistors at its drain.

11. The apparatus of claim 10, wherein the multiplier further comprises:
a differential choke;
a rectifying interleaver that is coupled to the differential choke; and
a VCO that is coupled to the rectifying interleaver.

12. The apparatus of claim 1, wherein the receiver circuitry further comprises:
a summing circuit that is coupled to the receive path for each transceiver;
an amplifier that is coupled to the summing circuit;
a filter that is coupled to the amplifier; and
digitization circuit that is coupled to the amplifier.

13. The apparatus of claim 12, wherein the local oscillator signal further comprises a first local oscillator signal, and wherein the local oscillator generates a second local oscillator signal, and wherein the receiver circuit further comprises a mixer that is coupled between the summing circuit and the amplifier and that receives the second local oscillator signal.

14. An apparatus comprising:
a local oscillator including:
a phase detector that receives a reference signal;
a charge pump that is coupled to the phase detector;
a low pass filter that is coupled to the charge pump;
a local oscillator VCO that generates a first local oscillator signal having that is greater than 40 GHz;
a plurality of dividers coupled in series with one another between the local oscillator VCO and the phase detector so as to provide a feedback signal to the phase detector that is generated from the first local oscillator signal, wherein the at least one of the plurality of dividers generates a second local oscillator having a frequency that is greater than 20 GHz;
a counter that receives the feedback signal and a control signal; and
a pulse generator that receives the second local oscillator signal, that is coupled to the counter, and that generates a pulse signal;
a distribution network that is coupled to the local oscillator so as to at least distribute the first local oscillator signal;
a plurality of transceivers, wherein each transceiver has a radiator, a transmit path that is coupled to the radiator, and a receive path that is coupled to the radiator, and wherein the radiators are arranged into an array, and wherein the transmit path for each transceiver includes:
a phase shifter is coupled to the distribution network so as to receive the first local oscillator signal;
a multiplier that is coupled to the phase shifter so as to receive a phase shifted first local oscillator signal;
an ILVCO having:
a first node;
a second node;
an inductive network that is coupled between the first and second nodes;
a capacitive network that is coupled between the first and second nodes;
a first MOS transistor that is coupled to the first node at its source or its drain and to the second node at its gate;
a second MOS transistor that is coupled to the second node at its source or its drain and to the first node at its gate;
a third MOS transistor that is coupled generally in parallel to the first MOS transistor;
a fourth MOS transistor that is coupled generally in parallel to the second MOS transistor; and
a balun that is coupled to the first multiplier and the gates of the third and fourth MOS transistors;
a PA that is coupled to the ILVCO and its radiator and that receives the pulse signal; and
receiver circuitry that is coupled to the receive path for each of the transceivers.

15. The apparatus of claim 14, wherein the PA further comprises:
a first capacitor that receives an output from the ILVCO;
a first inductor that is coupled to the first capacitor;
a second inductor that is coupled to the first inductor;
a second capacitor that is coupled to the second inductor;
a third inductor;
a fifth MOS transistor that is coupled to the first and second inductor at its gate and that is coupled to the third inductor;
a fourth inductor;
a fifth inductor;
a sixth MOS transistor that receives the pulse signal at its gate and that is coupled between the fourth and fifth inductors; and
a third capacitor that is coupled between the third and fifth inductors.

16. The apparatus of claim 15, wherein the receiver circuitry further comprises:
a summing circuit that is coupled to the receive path for each transceiver;
an amplifier that is coupled to the summing circuit;
a filter that is coupled to the amplifier; and
digitization circuit that is coupled to the amplifier.

17. The apparatus of claim 16, wherein the receiver circuit further comprises a mixer that is coupled between the summing circuit and the amplifier and that receives the second local oscillator signal.

18. An apparatus comprising:
a plurality of radiators that are arranged in a pattern for form an array;
a local oscillator that generates a local oscillator signal and a pulse signal;
a distribution network that is coupled to the local oscillator so as to at least distribute the local oscillator signal;
a plurality of transmitter paths, wherein each transmitter path is coupled between the distribution network and at least one of the radiators, and wherein each transmit path includes:
a phase shifter is coupled to the distribution network so as to receive the local oscillator signal;
a multiplier that is coupled to the phase shifter so as to receive a phase shifted local oscillator signal;
an ILVCO that is coupled to the multiplier; and
a PA that is coupled to the ILVCO and that receives the pulse signal; and a plurality of receiver paths, wherein each receiver path is coupled to at least one of the radiators;
receiver circuitry that is coupled to each receive path; and
a controller that is coupled to each phase shifter.

19. The apparatus of claim 18, wherein the local oscillator signal further comprises a first local oscillator signal, and wherein the local oscillator further comprises:
   a PLL that receives a reference signal and that generates the first local oscillator signal and a second local oscillator signal;
   a counter that receives a control signal and that is coupled to the PLL; and
   a pulse generator that is coupled to the counter and the PLL, wherein the pulse generator generates the pulse signal based at least in part on the second local oscillator signal and an output from the counter.

20. The apparatus of claim 19, wherein the PLL further comprises:
   a phase detector that receives the reference signal;
   a charge pump that is coupled to the phase detector;
   a low pass filter that is coupled to the charge pump;
   a VCO that is coupled to the low pass filter;
   an amplifier that is coupled to the VCO; and
   a plurality of dividers that are coupled in series with one another between the VCO and the phase detector.

21. The apparatus of claim 20, wherein each transmit path further comprises an amplifier that is coupled between the phase shifter and the multiplier.

22. The apparatus of claim 21, wherein the ILVCO further comprises:
   a first node;
   a second node;
   an inductive network that is coupled between the first and second nodes;
   a capacitive network that is coupled between the first and second nodes;
   a first MOS transistor that is coupled to the first node at its source or its drain and to the second node at its gate;
   a second MOS transistor that is coupled to the second node at its source or its drain and to the first node at its gate;
   a third MOS transistor that is coupled generally in parallel to the first MOS transistor;
   a fourth MOS transistor that is coupled generally in parallel to the second MOS transistor; and
   a balun that is coupled to the amplifier and the gates of the third and fourth MOS transistors.

23. The apparatus of claim 22, wherein the PA further comprises:
   a first capacitor that receives an output from the ILVCO;
   a first inductor that is coupled to the first capacitor;
   a second inductor that is coupled to the first inductor;
   a second capacitor that is coupled to the second inductor;
   a third inductor;
   a fifth MOS transistor that is coupled to the first and second inductor at its gate and that is coupled to the third inductor;
   a fourth inductor;
   a fifth inductor;
   a sixth MOS transistor that receives the pulse signal at its gate and that is coupled between the fourth and fifth inductors; and
   a third capacitor that is coupled between the third and fifth inductors.

24. The apparatus of claim 21, wherein the amplifier further comprises a first amplifier, and wherein the multiplier further comprises a first multiplier, and wherein each receive path further comprises:
   a low noise amplifier (LNA) that is coupled to the radiator;
   a second multiplier that is coupled to the first amplifier;
   a second amplifier that is coupled to second multiplier;
   a mixer that is coupled to the LNA and the second amplifier; and
   a third amplifier that is coupled to the mixer.

25. The apparatus of claim 24, wherein the mixer further comprises a first mixer, and wherein each receive path further comprises:
   a second mixer that is coupled to the first and third amplifiers; and
   a fourth amplifier that is coupled to the second mixer.

26. The apparatus of claim 21, wherein the amplifier further comprises a first amplifier, and wherein each transmit path further comprises a flip-flop that receives the pulse signal and that is coupled to the first amplifier, the ILVCO, and the PA, and wherein the multiplier further comprises a first multiplier, and wherein each receive path further comprises:
   an LNA;
   a second amplifier that is coupled to the ILVCO;
   a mixer that is coupled to the LNA and the second amplifier; and
   a third amplifier that is coupled to the mixer.

27. The apparatus of claim 18, wherein each phase shifter further comprises:
   a first input terminal;
   a second input terminal;
   a first inductor that is coupled to the first input terminal;
   a second inductor that is coupled to the second input terminal; and
   a plurality of phase shifters, wherein each phase shifter includes:
      a first MOS transistor that is coupled to the first input terminal at its drain;
      a second MOS transistor that is coupled to the second input terminal at its drain; and
      a third MOS transistor that is coupled to the sources of the first and second MOS transistors at its drain.

28. The apparatus of claim 27, wherein the multiplier further comprises:
   a differential choke;
   a rectifying interleaver that is coupled to the differential choke; and
   a VCO that is coupled to the rectifying interleaver.

29. The apparatus of claim 18, wherein the receiver circuitry further comprises:
   a summing circuit that is coupled to the receive path for each transceiver;
   an amplifier that is coupled to the summing circuit;
   a filter that is coupled to the amplifier; and
   digitization circuit that is coupled to the amplifier.

30. The apparatus of claim 29, wherein the local oscillator signal further comprises a first local oscillator signal, and wherein the local oscillator generates a second local oscillator signal, and wherein the receiver circuit further comprises a mixer that is coupled between the summing circuit and the amplifier and that receives the second local oscillator signal.

31. The apparatus of claim 30, wherein the summing circuit further comprises a summing amplifier tree.

* * * * *